US009887151B2

(12) United States Patent
Sato et al.

(10) Patent No.: US 9,887,151 B2
(45) Date of Patent: Feb. 6, 2018

(54) SEMICONDUCTOR DEVICE

(71) Applicant: Renesas Electronics Corporation, Tokyo (JP)

(72) Inventors: Yukihiro Sato, Tokyo (JP); Akira Muto, Tokyo (JP); Ryo Kanda, Tokyo (JP); Takamitsu Kanazawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/174,568

(22) Filed: Jun. 6, 2016

(65) Prior Publication Data
US 2017/0033035 A1 Feb. 2, 2017

(30) Foreign Application Priority Data

Jul. 31, 2015 (JP) .................................. 2015-152409

(51) Int. Cl.
| | |
|---|---|
| *H01L 23/00* | (2006.01) |
| *H01L 23/495* | (2006.01) |
| *H01L 23/31* | (2006.01) |
| *H01L 29/739* | (2006.01) |
| *H01L 27/06* | (2006.01) |
| *H01L 25/075* | (2006.01) |
| *H02P 27/06* | (2006.01) |

(52) U.S. Cl.
CPC .... *H01L 23/49562* (2013.01); *H01L 23/3114* (2013.01); *H01L 23/49541* (2013.01); *H01L 23/49575* (2013.01); *H01L 25/0753* (2013.01); *H01L 27/0664* (2013.01); *H01L 29/7397* (2013.01); *H01L 2224/0603* (2013.01); *H01L 2224/48137* (2013.01); *H01L 2224/48139* (2013.01); *H01L 2224/4903* (2013.01); *H01L 2224/49111* (2013.01); *H02P 27/06* (2013.01)

(58) Field of Classification Search
CPC .................................................. H01L 23/49562
See application file for complete search history.

(56) References Cited

U.S. PATENT DOCUMENTS

2015/0042373 A1* 2/2015 Nakamura ........... G01R 31/041
324/762.03

FOREIGN PATENT DOCUMENTS

JP 9-186288 A 7/1997

* cited by examiner

*Primary Examiner* — William Harriston
(74) *Attorney, Agent, or Firm* — McDermott Will & Emery LLP

(57) ABSTRACT

To improve the reliability of a semiconductor device. A chip mounting portion TAB5 is arranged to be shifted to the +x direction side. Further, a gate electrode pad of a semiconductor chip CHP1 (LV) and a pad of a semiconductor chip CHP3 are electrically coupled by a wire W1a and a wire W1b through a relay lead RL1. Likewise, a gate electrode pad of a semiconductor chip CHP1 (LW) and the pad of the semiconductor chip CHP3 are electrically coupled by a wire W1c and a wire W1d through a relay lead RL2. At this time, the structures of parts of the relay leads RL1 and RL2, which are exposed from a sealing body MR are different from the structures of respective parts exposed from the sealing body MR, of a plurality of leads LD1 and LD2 which function as external terminals.

19 Claims, 16 Drawing Sheets

SEMICONDUCTOR DEVICE

CROSS-REFERENCE TO RELATED APPLICATIONS

The disclosure of Japanese Patent Application No. 2015-152409 filed on Jul. 31, 2015 including the specification, drawings and abstract is incorporated herein by reference in its entirety.

BACKGROUND

The present invention relates to a semiconductor device, and to a technology effective when applied to a semiconductor device which functions as a component of an inverter, for example.

A configuration of a semiconductor device in which a pad and a lead (inner lead) formed in a first semiconductor chip are electrically coupled by a first wire, and the lead and a pad formed in a second semiconductor chip are electrically coupled by a second wire has been described in Japanese Unexamined Patent Publication Laid-Open No. Hei 9 (1997)-186288 (Patent Document 1).

RELATED ART DOCUMENT

Patent Document

[Patent Document 1] Japanese Unexamined Patent Publication Laid-Open No. Hei 9 (1997)-186288

SUMMARY

The present inventors newly have found out that in a semiconductor device in which semiconductor elements respectively formed in a plurality of semiconductor chips are controlled by a control circuit formed in a single control semiconductor chip, there is room for improvement to be shown below when a configuration in which the semiconductor chips and the control semiconductor chip are directly coupled by wires is adopted therein. That is, for example, when the number of the semiconductor chips coupled to the control semiconductor chip increases, the distance between each of some semiconductor chips and the control semiconductor chip inevitably becomes long. This means that the length of each of wires which directly couple some semiconductor chips and the control semiconductor chip becomes long. Further, there is concern that when the length of the wire becomes long, the adjacent wires become easy to contact each other due to a wire flow at the formation of a sealing body, for example, so that a short circuit failure is generated. Thus, in the semiconductor device which controls the semiconductor chips by the single control semiconductor chip, there is room for improvement thereon from the viewpoint of achieving an improvement in the reliability of the semiconductor device.

Other objects and novel features of the present invention will become apparent from the description of the present specification and the accompanying drawings.

In a semiconductor device according to one aspect of the present invention, a control pad of a semiconductor chip and an electrode pad of a control semiconductor chip are electrically coupled by a conductive member through a relay lead. At this time, the structure of a part of the relay lead, which is exposed from a sealing body is different from the structure of each of parts of a plurality of leads functioning as external terminals, which are exposed from the sealing body.

According to one aspect of the present invention, it is possible to improve the reliability of a semiconductor device.

DETAILED DESCRIPTION

Figure 1:
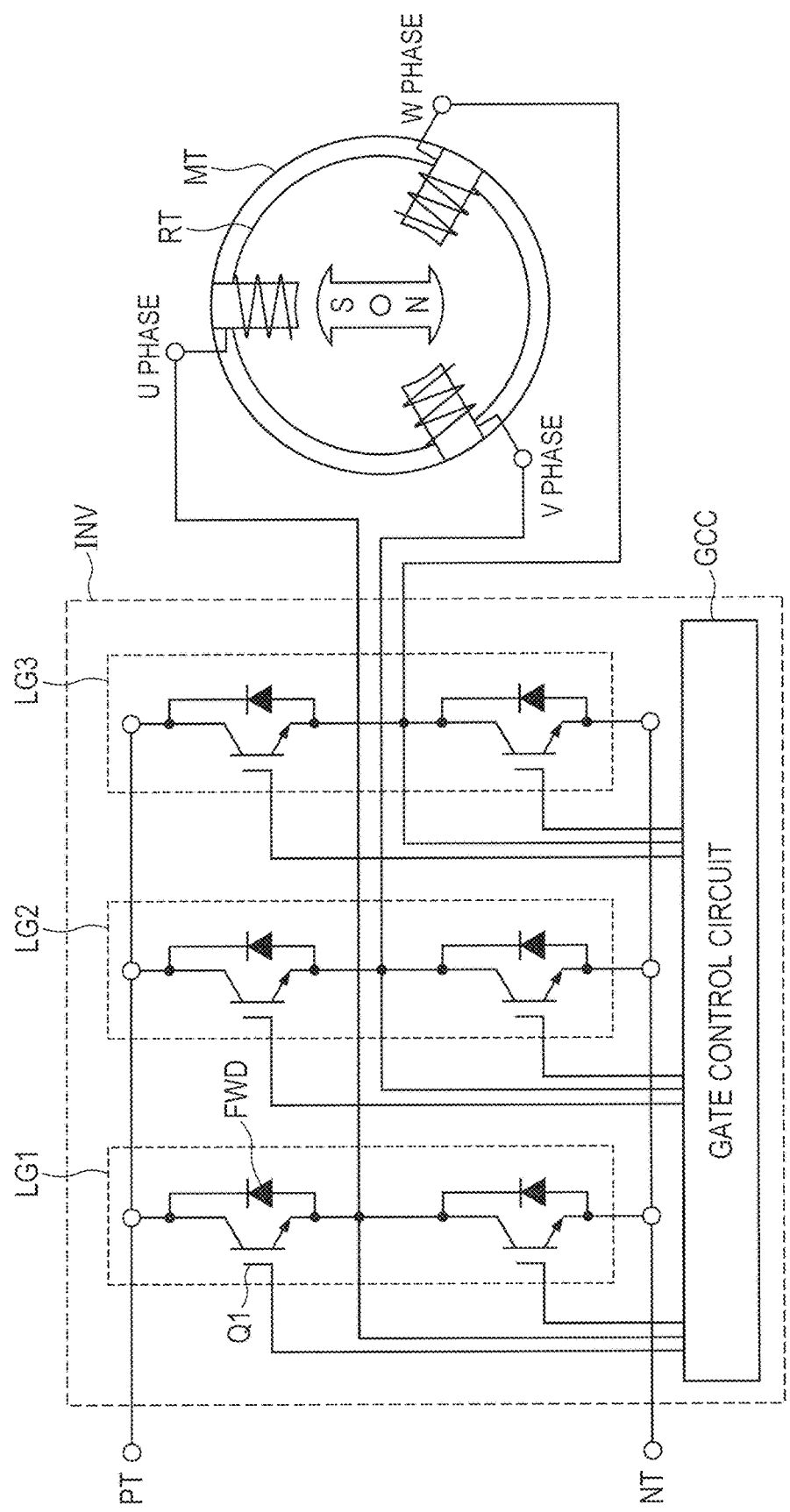
FIG. 1 is a circuit diagram showing a configuration of a motor circuit including an inverter circuit and a three-phase induction motor in an embodiment.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the other.

Also, when reference is made to the number of elements or the like (including the number of pieces, numerical values, quantity, range, etc.) in the following embodiments, the number thereof is not limited to a specific number and may be greater than or less than or equal to the specific number except for where otherwise specified in particular and definitely limited to the specific number in principle, etc.

It is further needless to say that in the following embodiments, components (also including component steps, etc.) employed therein are not always essential except for where otherwise specified in particular and considered to be definitely essential in principle, etc.

Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

The same reference numerals are respectively attached to the same members in principle in all the drawings for describing the embodiments, and a repeated description thereof will be omitted. Incidentally, even plan views may be hatched for clarity of illustration.

<Configuration Example of Three-Phase Inverter Circuit>

A semiconductor device according to the present embodiment is intended to be used in a drive circuit of a three-phase induction motor used in an air conditioner, etc., for example. Specifically, the present drive circuit includes an inverter circuit. The present inverter circuit is a circuit having a function of converting DC power into AC power.

FIG. 1 is a circuit diagram showing the configuration of a motor circuit including an inverter circuit and a three-phase induction motor in the present embodiment. In FIG. 1, the motor circuit has the three-phase induction motor MT and the inverter circuit INV. The three-phase induction motor MT is configured to be driven by three-phase voltages different in phase. Specifically, in the three-phase inductor motor MT, a three-phase AC called U, V and W phases dephased by 120° each other is used to generate a rotating magnetic field about a rotor RT being a conductor. In this case, the magnetic field is rotated about the rotor RT. This means that the magnetic flux crossing the rotor RT as the conductor changes. As a result, electromagnetic induction is generated in the rotor RT as the conductor and hence an induction current flows through the rotor RT. Then, the flowing of the induction current in the rotating magnetic field means that force is applied to the rotor RT by the Fleming's left-hand rule. The rotor RT is rotated by the force. Thus, it is understood that in the three-phase induction motor MT, the rotor RT can be rotated by using the three-phase AC. That is, the three-phase induction motor MT needs the three-phase AC. Thus, in the motor circuit, the three-phase AC is supplied to the three-phase induction motor by utilizing the inverter circuit INV which produces AC from DC.

A configuration example of the inverter circuit INV will be described below. As shown in FIG. 1, for example, IGBTQ1 and diodes FWD are provided corresponding to three phases in the inverter circuit INV in the present embodiment. That is, in the inverter circuit INV in the present embodiment, switching elements which serve as the components of the inverter circuit INV are realized by the configuration in which the IGBTQ1 and diodes FWD such as shown in FIG. 1, for example are inversely coupled in parallel. That is, in FIG. 1, upper and lower arms of a first leg LG1, upper and lower arms of a second leg LG2, and upper and lower arms of a third leg LG3 are respectively comprised of components in which the IGBTQ1 and diodes FWD are inversely coupled in parallel.

In other words, in the inverter circuit INV in the present embodiment, the IGBTQ1 and the diodes FWD are inversely coupled in parallel between a positive potential terminal PT and each phase (U phase, V phase and W phase) of the three-phase induction motor MT. Further, the IGBTQ1 and the diodes FWD are inversely coupled in parallel between each phase of the three-phase induction motor MT and a negative potential terminal NT. That is, the two IGBTQ1 and the two diodes FWD are provided for each phase. The six IGBTQ1 and the six diodes FWD are provided for the three phases. Then, a gate control circuit GCC is coupled to a gate electrode of each individual IGBTQ1. A switching operation of each IGBTQ1 is controlled by the gate control circuit GCC. In the inverter circuit INV configured in this way, the switching operations of the IGBTQ1 are controlled by the gate control circuit GCC to thereby convert DC power into three-phase AC power, which in turn is supplied to the three-phase induction motor MT.

<Need for Diode>

As described above, in the inverter circuit INV in the present embodiment, while the IGBTQ1 are used as the switching elements, the diodes FWD are provided so as to be inversely coupled in parallel with the IGBTQ1. The IGBTQ1 used as the switching element is required in terms of simply realizing a switching function by the switching element, but the diode FWD is considered not to have a need for its provision. When the inductance is included in a load coupled to the inverter circuit INV with regard to this point, it is necessary to provide the diode FWD. This reason will be described below.

When the load is of a pure resistor including no inductance, the diode FWD is not necessary because of no refluxing energy. When, however, a circuit including an inductance like a motor is coupled to the load, there is a mode in which a load current flows in the direction opposite to a switch being ON. That is, when the inductance is included in the load, energy may be returned from the load inductance to the inverter circuit INV (current may flow backward).

Since, at this time, the single IGBTQ1 does not have a function of enabling the reflux current to flow, there is a need to couple the diode FWD in antiparallel with the IGBTQ1. That is, when the inductance is included in the load as in the motor control in the inverter circuit INV, energy ($\frac{1}{2}LI^2$) accumulated in the inductance must always be emitted when the IGBTQ1 is turned OFF. However, the single IGBTQ1 is not capable of making the reflux current for releasing the energy accumulated in the inductance to flow. Thus, in order to feed back the electrical energy accumulated in the inductance, the diode FWD is coupled in antiparallel with the IGBTQ1. That is, the diode FWD has a function of allowing the reflux current to flow to release the electrical energy accumulated in the inductance. It is understood from the above that the inverter circuit coupled to the load including the inductance needs to provide the diode FWD in antiparallel with the IGBTQ1 being the switching element. This diode FWD is called a free wheel diode.

<Structure of IGBT>

The structures of the IGBTQ1 and the diode FWD which configure the inverter circuit INV in the present embodiment will be described with reference to the accompanying drawings. The inverter circuit INV in the present embodiment includes the IGBTQ1 and the diodes FWD.

Figure 2:
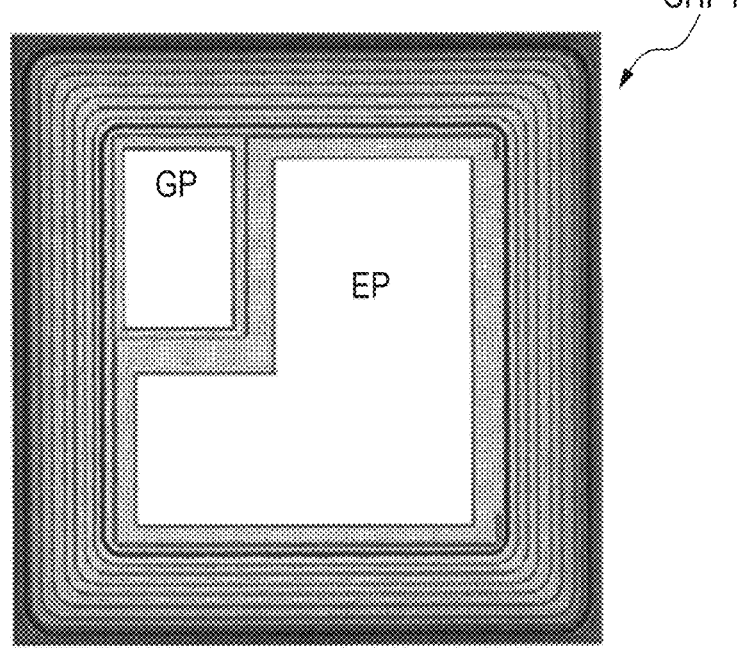
FIG. 2 is a plan view showing an outer shape of a semiconductor chip formed with an IGBT.

FIG. 2 is a plan view showing an outer shape of a semiconductor chip CHP1 formed with an IGBTQ1. A main surface (surface) of the semiconductor chip CHP1 is illustrated in FIG. 2. As shown in FIG. 2, the planar shape of the semiconductor chip CHP1 in the present embodiment assumes a square shape, for example. Further, an emitter electrode pad EP and a gate electrode pad GP are formed over the surface of the semiconductor chip CHP1 formed as the square shape. On the other hand, although not shown in FIG. 2, a collector electrode pad is formed over the back surface on the side opposite to the surface of the semiconductor chip CHP1.

<Device Structure of IGBT>

Figure 3:
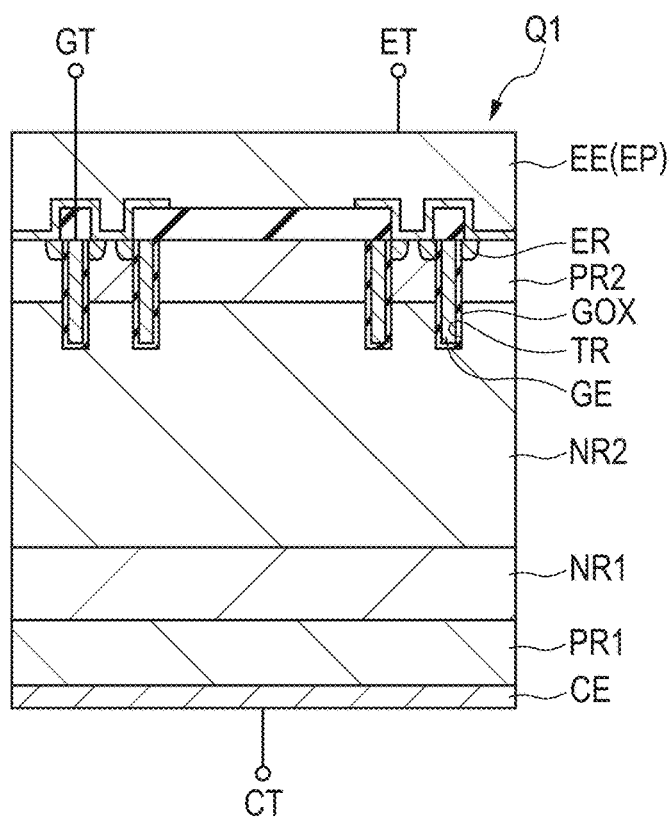
FIG. 3 is a sectional view showing a device structure of the IGBT in the embodiment.

A description will subsequently be made about a device structure of the IGBTQ1. FIG. 3 is a sectional view showing the device structure of the IGBTQ1 in the present embodiment. In FIG. 3, the IGBTQ1 has a collector electrode CE formed at the back surface of the semiconductor chip. A $p^+$ type semiconductor region PR1 is formed over the collector electrode CE. An $n^+$ type semiconductor region NR1 is formed over the $p^+$ type semiconductor region PR1, and an $n^-$ type semiconductor region NR2 is formed over the $n^+$ type semiconductor region NR1. Then, a p type semiconductor region PR2 is formed over the $n^-$ type semiconductor region NR2, and a trench TR is formed which penetrates the p type semiconductor region PR2 and reaches the $n^-$ type semiconductor region NR2. Further, an $n^+$ type semiconductor region ER which serves as an emitter region is formed in alignment with the trench TR. A gate insulating film GOX comprised of, for example, a silicon oxide film is formed inside the trench TR. A gate electrode GE is formed through the gate insulting film GOX. The gate electrode GE is formed of, for example, a polysilicon film and formed so as to fill the trench TR. Further, although the trench gate structure is illustrated in FIG. 3, the IGBTQ1 is not limited to it. For example, although not shown in the drawing, an IGBT using a planar gate structure formed over a silicon substrate may be adopted.

In the IGBTQ1 configured in this manner, the gate electrode GE is coupled to a gate terminal GT through the gate electrode pad GP shown in FIG. 2. Likewise, the $n^+$ type semiconductor region ER which serves as the emitter region is electrically coupled to an emitter terminal ET through an emitter electrode EE (emitter electrode pad EP). The $p^+$ type semiconductor region PR1 which serves as a collector region is electrically coupled to the collector electrode CE formed over the back surface of the semiconductor chip.

The IGBTQ1 configured in this manner combines high-speed switching characteristics and voltage drive characteristics of a power MOSFET, and low ON voltage characteristics of a bipolar transistor.

Incidentally, the $n^+$ type semiconductor region NR1 is called a buffer layer. The $n^+$ type semiconductor region NR1 is provided to prevent a punch-through phenomenon that when the IGBTQ1 is being turned OFF, a depletion layer grown from the p type semiconductor region PR2 to within the n-type semiconductor region NR2 is brought into contact with the $p^+$ type semiconductor region PR1 formed at a layer under the $n^-$ type semiconductor region NR2. Further, the $n^+$ type semiconductor region NR1 is provided for purposes of a restriction of the amount of holes injected from the $p^+$ type semiconductor region PR1 to the $n^-$ type semiconductor region NR2, etc.

<Operation of IGBT>

The operation of the IGBTQ1 in the present embodiment will next be described. A description will first be made about the turning-ON operation of the IGBTQ1. In FIG. 3, the MOSFET having the trench gate structure is turned ON by applying a sufficient positive voltage between the gate electrode GE and the $n^+$ type semiconductor region ER defined as the emitter region. In this case, the $p^+$ type semiconductor region PR1 which configures the collector region, and the $n^-$ type semiconductor region NR2 are forward biased therebetween, so that positive holes are injected from the $p^+$ type semiconductor region PR1 to the $n^-$ type semiconductor region NR2. Subsequently, electrons equivalent to as much as the plus charges of the injected positive holes are collected to the $n^-$ type semiconductor region NR2. Thus, a reduction in the resistance of the $n^-$ type semiconductor region NR2 occurs (conductivity modulation), and hence the IGBTQ1 is brought to an ON state.

While the voltage of junction between the $p^+$ type semiconductor region PR1 and the $n^-$ type semiconductor region NR2 is added to an on voltage, the IGBTQ1 rather than the power MOSFET is brought to a low on voltage under such a high breakdown voltage so as to occupy most of the on resistance because the resistance value of the $n^-$ type semiconductor region NR2 is reduced by one digit or more due to the conductivity modulation. Accordingly, it is understood that the IGBTQ1 is a device effective for an increase in the breakdown voltage. That is, in order to achieve the high breakdown voltage, there is a need for the power MOSFET to increase the thickness of an epitaxial layer used as a drift layer. In this case, however, the on resistance also rises. On the other hand, in the IGBTQ1, the conductivity modulation occurs at the turn-on operation of the IGBTQ1 even though the thickness of the $n^-$ type semiconductor region NR2 is increased to achieve the high breakdown voltage. It is therefore possible to make the on resistance lower than that of the power MOSFET. That is, according to the IGBTQ1, the low on-resistance device can be realized compared with the power MOSFET even in achieving the high breakdown voltage.

Subsequently, a description will be made about the turning-off operation of the IGBTQ1. When the voltage between the gate electrode GE and the $n^+$ type semiconductor region ER defined as the emitter region is lowered, the MOSFET having the trench gate structure is turned OFF. In this case, the injection of positive holes from the p type semiconductor region PR1 to the $n^-$ type semiconductor region NR2 is stopped and the already-injected positive holes also come to the end of their lives, thereby resulting in a decrease in number.

The remaining positive holes directly flow out to the emitter electrode EE side (tail current), and the IGBTQ1 is brought to an OFF state when the flowing out thereof is completed. It is possible to cause the IGBTQ1 to perform its ON/OFF operation in this manner.

<Structure of Diode>

Figure 4:
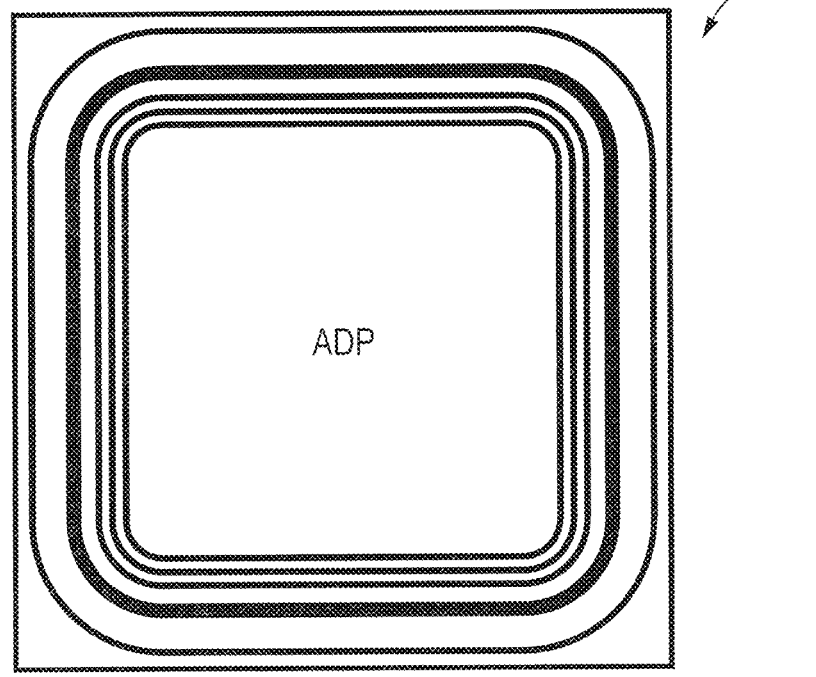
FIG. 4 is a plan view showing an outer shape of a semiconductor chip formed with a diode.

Next, FIG. 4 is a plan view showing an outer shape of a semiconductor chip CHP2 formed with a diode FWD. A main surface (surface) of the semiconductor chip CHP2 is illustrated in FIG. 4. As shown in FIG. 4, the planar shape of the semiconductor chip CHP2 in the present embodiment takes a square shape. Then, an anode electrode pad ADP is formed over the surface of the semiconductor chip CHP2 having the square shape. On the other hand, although not shown in the drawing, a cathode electrode pad is formed over the entire back surface on the side opposite to the surface of the semiconductor chip CHP2.

Figure 5:
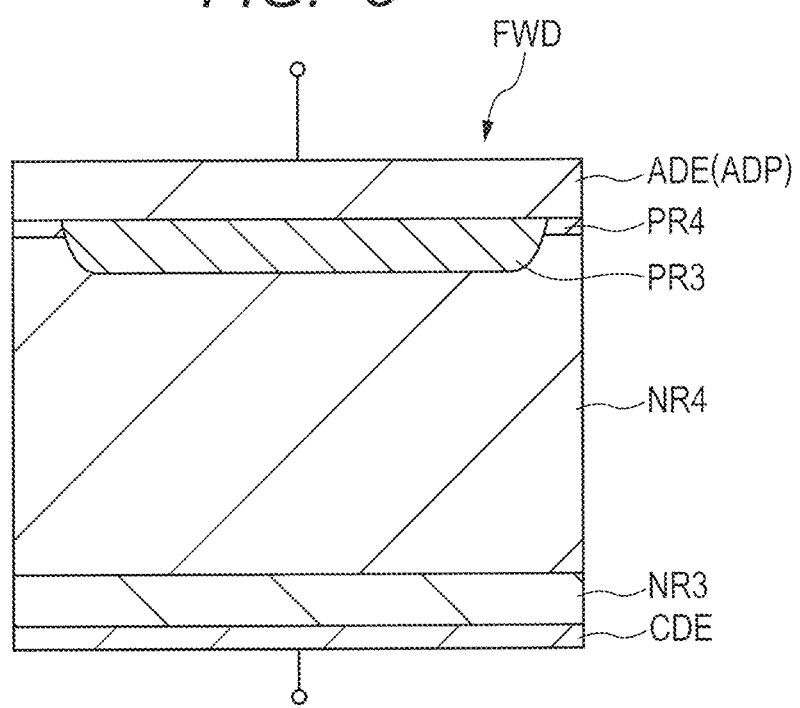
FIG. 5 is a sectional view showing a device structure of the diode.

Subsequently, a description will be made about the device structure of the diode FWD. FIG. 5 is a sectional view showing the device structure of the diode FWD. In FIG. 5, a cathode electrode CDE is formed over the back surface of the semiconductor chip, and an n+ type semiconductor region NR3 is formed over the cathode electrode CDE. Then, an n− type semiconductor region NR4 is formed over the n+ type semiconductor region NR3, and a p type semiconductor region PR3 is formed over the n− type semiconductor region NR4. An anode electrode ADE (anode electrode pad ADP) is formed over the p type semiconductor region PR3 and a p− type semiconductor region PR4. The anode electrode ADE is comprised of, for example, aluminum-silicon.

<Operation of Diode>

According to the diode FWD configured in this manner, when a positive voltage is applied to the anode electrode ADE, and a negative voltage is applied to the cathode electrode CDE, a pn junction between the n− type semiconductor region NR4 and the p type semiconductor region PR3 is forward biased so that current flows. On the other hand, when a negative voltage is applied to the anode electrode ADE, and a positive voltage is applied to the cathode electrode CDE, the pn junction between the n− type semiconductor region NR4 and the p type semiconductor region PR3 is reverse biased so that no current flows. It is possible to operate the diode FWD having the rectifying function in the above-described manner.

<Configuration of Gate Control Circuit>

Figure 6:
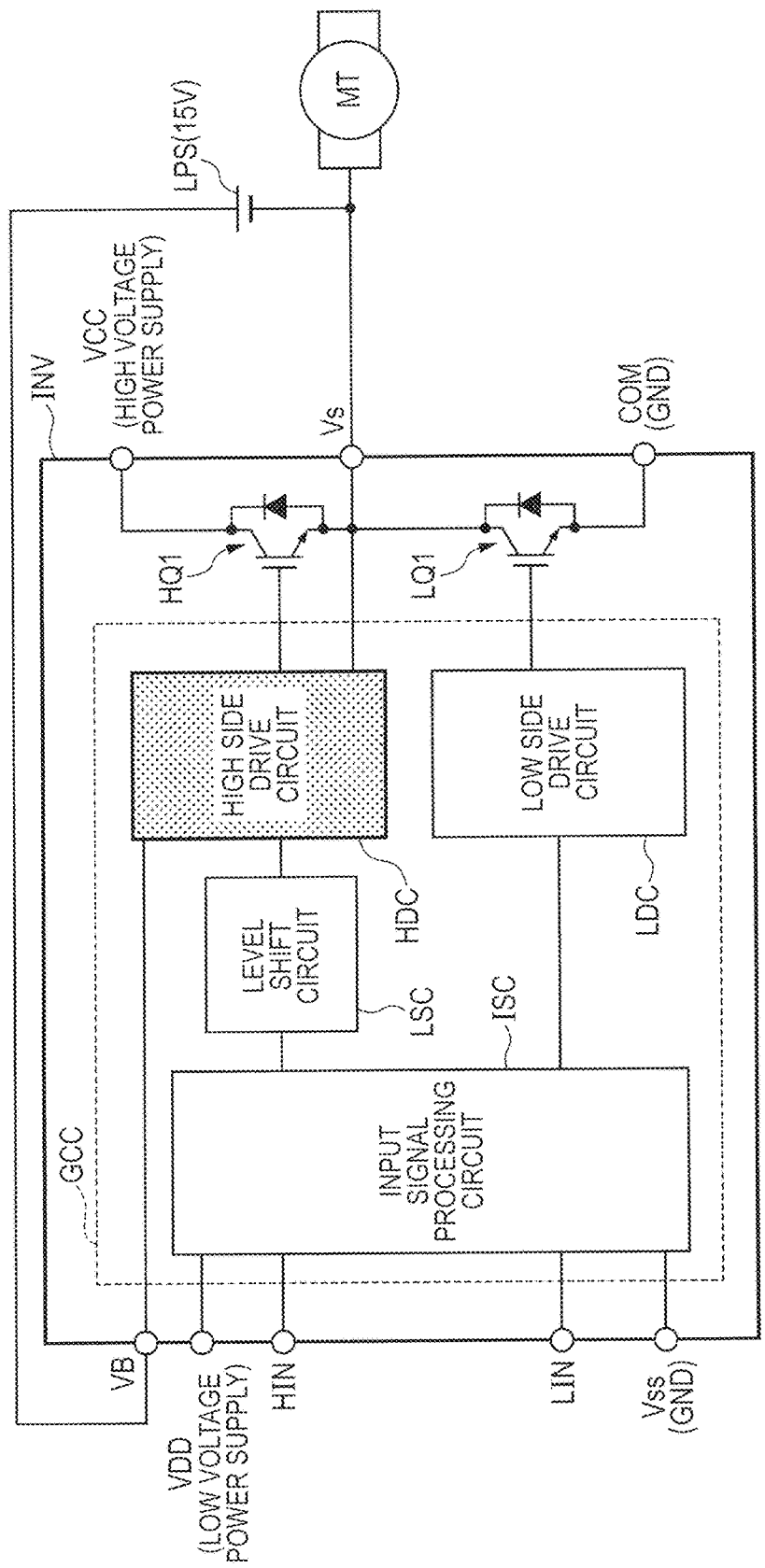
FIG. 6 is a diagram showing a circuit block configuration of a gate control circuit.

Subsequently, FIG. 6 is a diagram showing a circuit block configuration of the gate control circuit GCC. In FIG. 6, the configuration of the gate control circuit GCC which controls one of the three phases in the inverter circuit INV for driving the three-phase induction motor MT will be described by taking for example one phase thereof. In FIG. 6, for example, a high side IGBT (HQ1) and a low side IGBT (LQ1) which configure one phase of the inverter circuit INV are coupled in series between a terminal VCC electrically coupled to a high voltage power supply (600V), and a terminal COM electrically coupled to ground. Further, an intermediate node between the high side IGBT (HQ1) and the low side IGBT (LQ1) is electrically coupled to the three-phase induction motor MT through a terminal Vs.

Here, the gate control circuit GCC is configured to control the ON/OFF operation of the high side IGBT (HQ1) and the ON/OFF operation of the low side IGBT (LQ1). For example, the gate control circuit GCC controls a gate voltage applied to a gate electrode of the high side IGBT (HQ1) to thereby realize the ON/OFF operation of the high side IGBT (HQ1), and controls a gate voltage applied to a gate electrode of the low side IGBT (LQ1) to thereby realize the ON/OFF operation of the low side IGBT (LQ1).

Specifically, the gate control circuit GCC is coupled to a terminal Vss electrically coupled to a terminal VDD electrically coupled to a low voltage power supply, and ground. Further, the gate control circuit GCC has an input signal processing circuit ISC which processes input signals inputted from terminals HIN and LIN of the inverter circuit INV, a level shift circuit LSC, a low side drive circuit LDC, and a high side drive circuit HDC.

Further, the low side drive circuit LDC controls the gate voltage applied to the gate electrode of the low side IGBT (LQ1), based on a processing signal outputted from the input signal processing circuit ISC. For example, the low side drive circuit LDC inputs a GND potential (ground potential) from the terminal Vss and supplies a gate voltage generated on the basis of the GND potential to the gate electrode of the low side IGBT (LQ1). Here, when the gate voltage supplied to the gate electrode is greater than or equal to a threshold voltage with respect to the GND potential, the low side IGBT (LQ1) is turned ON. On the other hand, when the gate voltage supplied to the gate electrode is less than the threshold voltage with respect to the GND potential, the low side IGBT (LQ1) is turned OFF. Thus, the ON/OFF operation of the low side IGBT (LQ1) is controlled by the low side drive circuit LDC.

On the other hand, after the input of the processing signal of the input signal processing circuit ISC to the level shift circuit LSC, the high side drive circuit I-DC controls the gate voltage applied to the gate electrode of the high side IGBT (HQ1), based on an output signal from the level shift circuit LSC. For example, the high side drive circuit HDC inputs a reference potential defined as the reference from the terminal Vs. That is, the high side drive circuit HDC also needs to generate the gate voltage applied to the gate electrode of the high side IGBT (HQ1), but needs the reference potential when generating the gate voltage. In this regard, for example, the GND potential inputted from the terminal Vss used in the low side drive circuit LDC is considered to be used in the high side drive circuit HDC, but is not capable of using the GND potential inputted from the terminal Vss as the reference potential. That is, in FIG. 6, the low side IGBT (LQ1) can be turned ON by applying a gate voltage greater than or equal to a threshold value thereof with respect to an emitter potential of the low side IGBT (LQ1). Therefore, the gate voltage of the low side IGBT (LQ1) is generated on the basis of the emitter potential of the low side IGBT (LQ1). Since, at this time, the emitter potential of the low side IGBT (LQ1) is the same potential as the GND potential, the gate voltage of the low side IGBT (LQ1) can be generated with the GND potential inputted from the terminal Vss as the reference voltage.

On the other hand, an emitter potential of the high side IGBT (HQ1) is used as for a reference potential even in the high side IGBT (HQ1) as shown in FIG. 6, but varies between the GND potential and a power supply potential. That is, when the low side IGBT (LQ1) is ON, the emitter potential of the high side IGBT (HQ1) becomes the same potential as the GND potential. On the other hand, when the high side IGBT (HQ1) is ON, the emitter potential of the high side IGBT (HQ1) becomes the same potential as the power supply potential. This means that it is necessary to generate the gate voltage on the basis of the power supply potential in order to turn ON the high side IGBT (HQ1) Accordingly, it is not possible to generate the gate voltage applied to the gate electrode of the high side IGBT (HQ1) on the basis of the GND potential inputted from the terminal Vss.

It follows from this that in the high side drive circuit HDC, the emitter potential of the high side IGBT (HQ1) is inputted from the terminal Vs, and the gate voltage applied to the gate electrode of the high side IGBT (HQ1) is generated on the basis of the potential inputted from the terminal Vss. Thus, since the potential inputted from the terminal Vs varies up to the power supply potential, the gate voltage of the high side IGBT (HQ1) generated on the basis of the potential inputted from the terminal Vs needs a potential higher than the power supply potential. It follows from this that in the high side drive circuit HDC, for example, a terminal VB is coupled to a low voltage power supply LPS located outside the inverter circuit INV, and the potential inputted from the terminal VB and the potential inputted from the above terminal Vs are used to thereby generate the gate voltage higher than the power supply potential. This gate voltage is supplied to the gate electrode of the high side IGBT (HQ1). Thus, the high side IGBT (HQ1) is turned ON when the gate voltage supplied to the gate electrode is greater or equal to a threshold voltage thereof with respect to the reference potential, whereas when the gate voltage supplied to the gate electrode is less than the threshold voltage with respect to the reference potential, the high side IGBT (HQ1) is turned OFF. The ON/OFF operation of the high side IGBT (HQ1) is controlled by the high side drive circuit HDC in this manner.

<Configuration of Semiconductor Chip Embodying Gate Control Circuit>

Although the above-described gate control circuit GCC can be realized by, for example, a semiconductor chip formed with an integration circuit, the semiconductor chip having embodied the gate control circuit GCC has feature points shown below. That is, the input signal processing circuit ISC, the level shift circuit LSC, and the low side drive circuit LDC which are the components of the gate control circuit GCC, are circuit-designed on the basis of the GND potential supplied from the terminal Vss, they can be built into a semiconductor substrate. On the other hand, since the high side drive circuit HDC is circuit-designed on the basis of the potential varied up to the power supply potential supplied from the terminal Vs, the high side drive circuit HDC is required to be formed with being separated from the semiconductor substrate (terminal Vss) Specifically, in the high side drive circuit HDC, a floating structure having a high breakdown voltage is adopted and a "floating island structure" independent from the low side drive circuit LDC is used. Further, the "floating island structure" has a limitation to the transfer of signals to and from the low side drive circuit LDC and is capable of transferring only a pulse signal through the level shift circuit LSC. From this point, each pad necessary for the high side drive circuit HDC needs to be formed into the "floating island structure". As described above, the semiconductor chip formed with the gate control circuit GCC has a feature point that the "floating island structure" is formed in the semiconductor chip formed with the gate control circuit GCC.

DESCRIPTION OF RELATED ARTS

Figure 7:
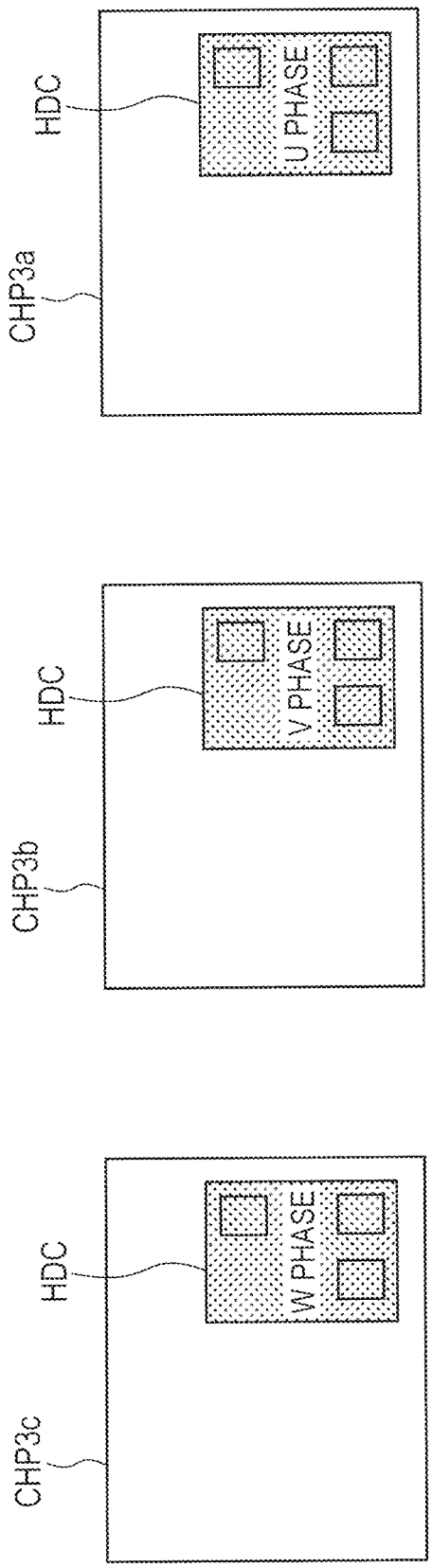
FIG. 7 is a diagram showing a configuration example of a semiconductor chip embodying each gate control circuit in a related art.

FIG. 7 is a diagram showing a configuration example of each semiconductor chip which embodies a gate control circuit in each related art. Here, the "related art" mentioned in the present specification is a technology having problems newly found by the inventors. This is not a known related art, but a technology described with intention for it to be a technology (unknown technology) based on the assumption of a novel technical idea.

As shown in FIG. 7, in the first related art, gate control circuits are formed in a plurality of semiconductor chips respectively and used in a semiconductor device of a three-phase inverter circuit. Specifically, in the first related art, a gate control circuit corresponding to a U phase is formed in a semiconductor chip CHP3a. A control circuit corresponding to a V phase is formed in a semiconductor chip CHP3b. A gate control circuit corresponding to a W phase is formed in a semiconductor chip CHP3c. Further, the three semiconductor chips CHP3a to CHP3c respectively have a "floating island structure" formed with a high side drive circuit HDC.

Figure 8:
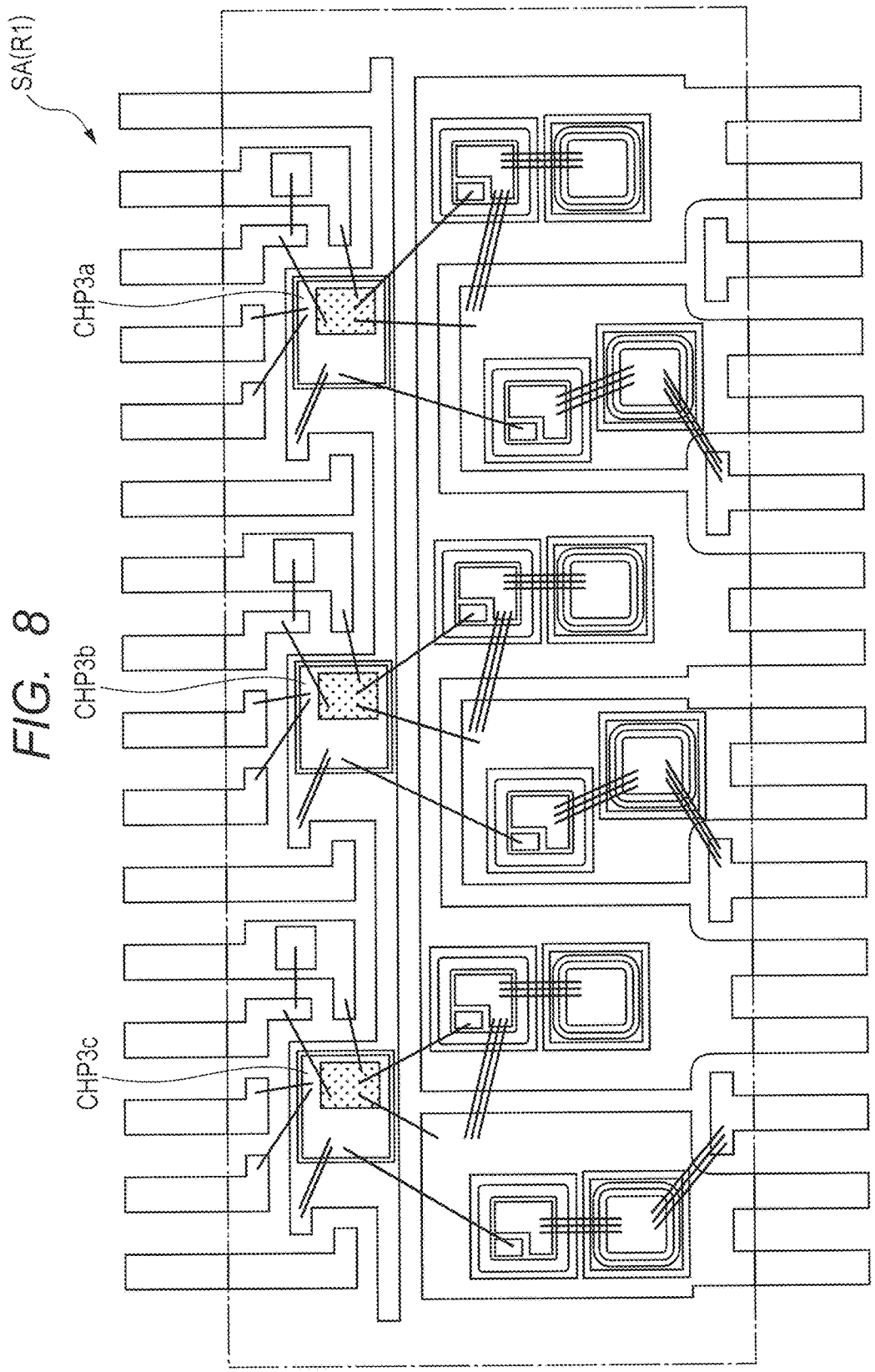
FIG. 8 is a typical plan view showing a semiconductor device which realizes a three-phase inverter circuit in a first related art.

FIG. 8 is a typical plan view showing a semiconductor device SA (R1) which realizes the three-phase inverter circuit in the first related art. In FIG. 8, the semiconductor device SA (R1) in the first related art has the three semiconductor chips CHP3a to CHP3c each formed with the gate control circuit. Further, for example, the semiconductor chip CHP3a corresponding to the U phase is arranged in the vicinity of a high side IGBT and a low side IGBT which configure the U phase of the three-phase inverter circuit. The semiconductor chip CHP3b corresponding to the V phase is arranged in the vicinity of a high side IGBT and a low side IGBT which configure the V phase of the three-phase inverter circuit. Likewise, the semiconductor chip CHP3c corresponding to the W phase is arranged in the vicinity of a high side IGBT and a low side IGBT which configure the W phase of the three-phase inverter circuit. Thus, as shown in FIG. 8, in the first related art, the gate control circuits which configure the three-phase inverter circuit are dispersed into the three semiconductor chips CHP3a to CHP3c, so that they can be arranged close to their corresponding IGBT. Therefore, the lengths of wires respectively coupled to the three semiconductor chips CHP3a to CHP3c are not so long. That is, in the semiconductor device SA (R1) in the first related art, the configuration that the length of each wire becomes long is not actualized.

Since, however, the gate control circuits configuring the three-phase inverter circuit are dispersed into the three semiconductor chip CHP3a to CHP3c in the first related art, the number of the semiconductor chips which configure the semiconductor device SA (R1) in the first related art increases, thus causing an increase in the manufacturing cost. The gate control circuits which configure the three-phase inverter circuit are therefore considered to be formed in one semiconductor chip. Since the number of the semiconductor chips which configure the gate control circuits can be reduced in this case, it is possible to achieve a reduction in the manufacturing cost of the semiconductor device.

Figure 9:
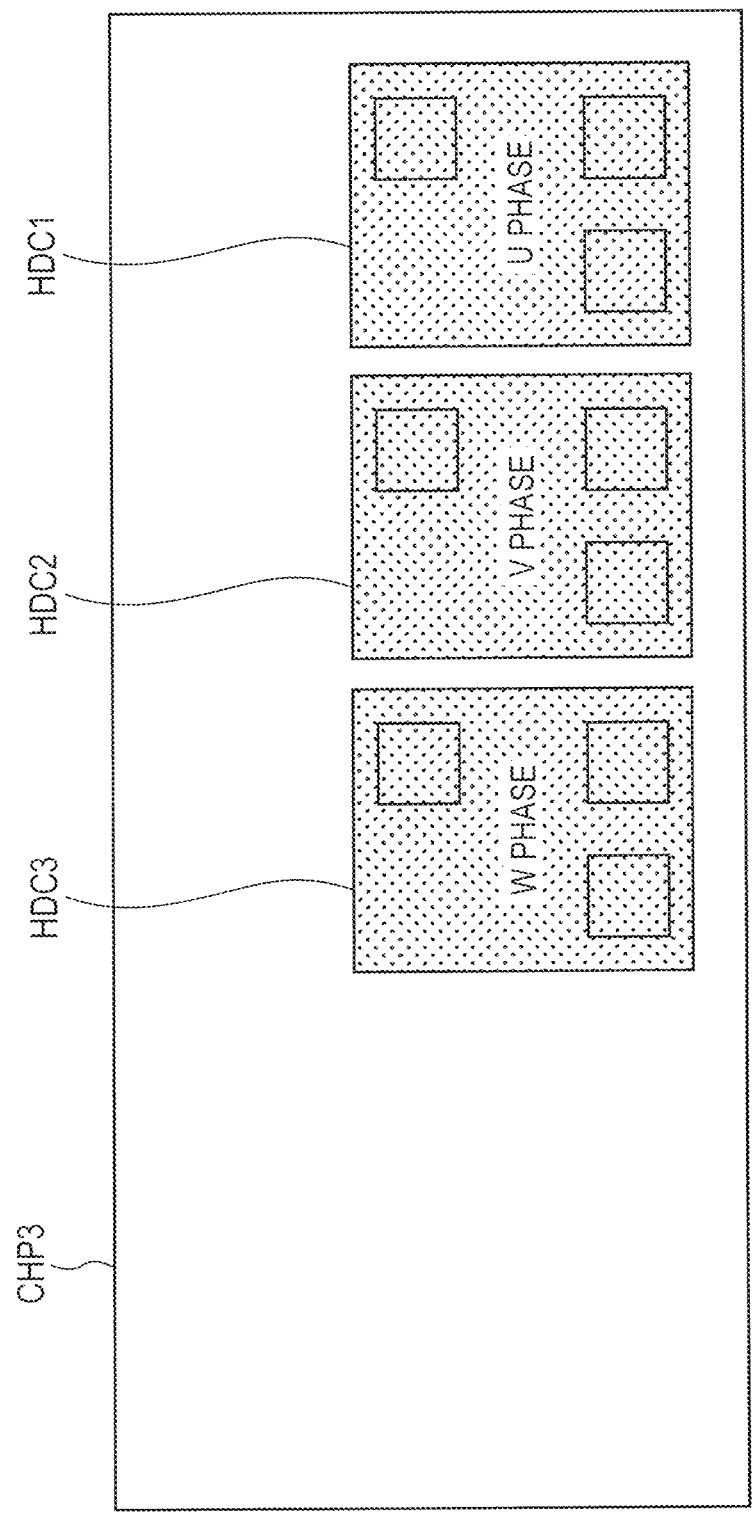
FIG. 9 is a plan view typically showing a semiconductor chip formed by combining gate control circuits which configure a three-phase inverter circuit.

Specifically, FIG. 9 is a plan view typically showing a single semiconductor chip CHP3 collectively formed with gate control circuits which configure the three-phase inverter circuit. As shown in FIG. 9, the semiconductor chip CHP3 is formed with a "floating island structure" formed with a high side drive circuit HDC1 corresponding to a U phase, a "floating island structure" formed with a high side drive circuit HDC2 corresponding to a V phase, and a "floating island structure" formed with a high side drive circuit HDC3 corresponding to a W phase.

Since the gate control circuits which configure the three-phase inverter circuit can be collected by using the semiconductor chip CHP3 configured in this manner, it is considered that the manufacturing cost of the semiconductor device which configures the three-phase inverter circuit can be reduced. This configuration however results in manifestation of new room for improvement.

Figure 10:
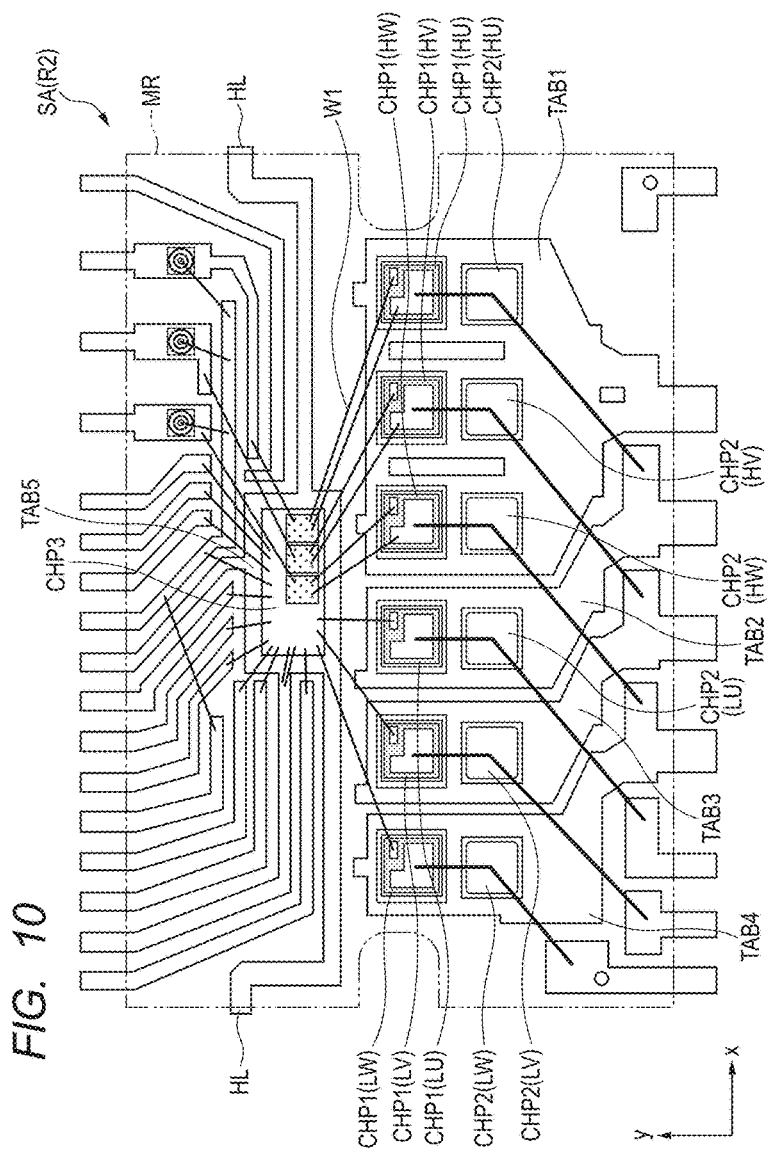
FIG. 10 is a plan view typically showing a mounting configuration example of a semiconductor device which realizes a three-phase inverter circuit in a second related art.

This room for improvement will hereinafter be described while using the second related art. FIG. 10 is a plan view typically showing a mounting configuration example of a semiconductor device SA (R2) which realizes a three-phase inverter circuit in the second related art. As shown in FIG. 10, in the semiconductor device SA (R2) in the second related art, chip mounting portions TAB1 to TAB4 are arranged so as to be aligned in an x direction. A chip mounting portion TAB5 is disposed on the upper side (y-direction side) of these chip mounting portions TAB1 to TAB4. Further, a semiconductor chip CHP1 (HU) formed with a high side IGBT corresponding to a U phase, a semiconductor chip CHP1 (HV) formed with a high side IGBT corresponding to a V phase, and a semiconductor chip CHP1 (HW) formed with a high side IGBT corresponding to a W phase are mounted over the chip mounting portion TAB1. Moreover, semiconductor chips CHP2 (HU), CHP2 (HV), and CHP2 (HW) respectively formed with diodes are also mounted over the chip mounting portion TAB1.

Likewise, a semiconductor chip CHP1 (LU) formed with a low side IGBT corresponding to the U phase, and a semiconductor chip CHP2 (LU) formed with a diode are mounted over the chip mounting portion TAB2. Also, a semiconductor chip CHP1 (LV) formed with a low side IGBT corresponding to the V phase, and a semiconductor chip CHP2 (LV) formed with a diode are mounted over the chip mounting portion TAB3. Further, a semiconductor chip CHP1 (LW) formed with a low side IGBT corresponding to the W phase, and a semiconductor chip CHP2 (LW) formed with a diode are mounted over the chip mounting portion TAB4.

On the other hand, the semiconductor chip CHP3 collectively formed with the gate control circuits of the three-phase inverter circuit is mounted over the chip mounting portion TAB5 coupled to a conductive member HL.

Now, when it is not necessary to distinguish a plurality of semiconductor chips formed with IGBTs which configure the three-phase inverter circuit, they will be called simply "IGBT chips" in the present specification. Likewise, when it is not necessary to distinguish a plurality of semiconductor chips formed with diodes which configure the three-phase inverter circuit, they will be called simply "diode chips" in the present specification.

In this case, as shown in FIG. 10, the semiconductor chip CHP3 and the six IGBT chips are respectively electrically coupled by wires W1. At this time, in the second related art shown in FIG. 10, the semiconductor chip CHP3 is disposed centrally as seen in the x direction in which the six IGBT chips are arranged. As a result, in the second related art, the length of each of the wires W1 coupling the IGBT chips disposed at both ends and the semiconductor chip CHP3 becomes long. That is, in the second related art, each of the six IGBT chips disposed so as to be arranged in the x direction, and one semiconductor chip CHP3 disposed centrally as seen in the x direction are electrically coupled to each other. From this point of view, the wire W1 which couples the semiconductor chip CHP1 (HU) disposed at one end, and the semiconductor chip CHP3, and the wire W1 which couples the semiconductor chip CHP1 (LW) disposed at the other end, and the semiconductor chip CHP3 become inevitably the longest in length. Thus, when the length of the wire W1 becomes long, a wire flow of the long wire W1 becomes easy to occur due to pressure by the injection of a resin in a resin sealing process for forming a sealing body, for example. There is hence a high possibility that a short circuit failure will occur between the adjacent wires W1. Further, the increase in the length of the wire W1 means that the parasitic resistance and inductance of the wire W1 increase. There is therefore a fear that the electrical characteristics of the semiconductor device will be degraded.

That is, the second related art can be reduced in manufacturing cost by the collective formation of the gate control circuits of the three-phase inverter circuit into one semiconductor chip CHP3 as compared with the first related art in which the gate control circuits are formed with being dispersed into the semiconductor chips every phase. On the other hand, the room for improvement not actualized in the first related art becomes apparent in the second related art. Specifically, as described above, one semiconductor chip CHP3 and the six IGBT chips respectively have to be coupled. As a result, the room for improvement exists in terms of the reliability of the semiconductor device and the electrical characteristics of the semiconductor device due to the length of each wire W1 of some of the wires W1 becoming long.

Here, in the second related art, the semiconductor device SA (R2) is manufactured by using a single lead frame. It is however considered that a wiring board is also used together with the lead frame as a measure to the above-described room for improvement. This is because wiring can be designed in a routed manner such that the length of each wire W1 becomes short by utilizing the degree of freedom of wiring peculiar to the wiring board while the semiconductor chip CHP3 is mounted over the wiring board. That is, the lengths of the respective wires W1 can be shortened by the routing of wiring by the wiring board even if one semiconductor chip CHP3 and the six IGBT chips are respectively coupled by the wires W1 by manufacturing the semiconductor device SA (R2) configuring the three-phase inverter circuit by using the lead frame and the wiring board.

Since, however, the wiring board is also used in addition to the lead frame in the case of such a configuration, the manufacturing cost of the semiconductor device rises. That is, in the second related art, even though the reduction in the manufacturing cost can be achieved by collectively forming the gate control circuits of the three-phase inverter circuit into one semiconductor chip CHP3, the use of the wiring board will rather cause the rise in the manufacturing cost.

Thus, in the present embodiment, as with the second related art, contrivances are made to suppress degradation in reliability of the semiconductor device and a deterioration in the electrical characteristics of the semiconductor device due to the length of each of some wires W1 being increased, without using the wiring board on the assumption of the configuration that the gate control circuits of the three-phase inverter circuit are collectively formed into one semiconductor chip CHP3. The technical idea in the present embodiment given such conveniences will be described below with reference to the accompanying drawings.

<Configuration of Semiconductor Device in the Embodiment>

Figure 11:
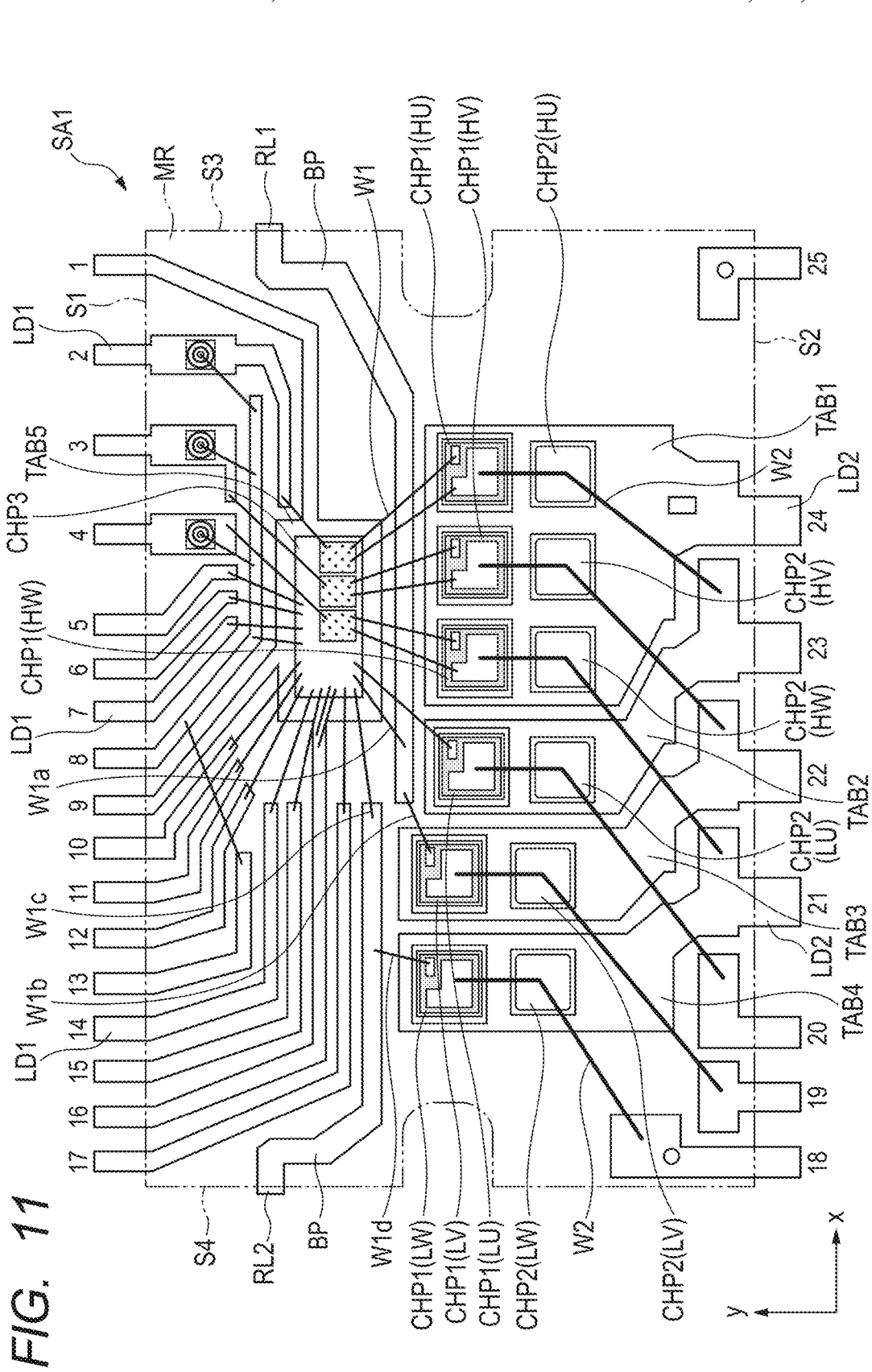
FIG. 11 is a plan view typically showing a mounting configuration of a semiconductor device according to an embodiment.

FIG. 11 is a plan view typically showing a mounting configuration of a semiconductor device SA1 in the present embodiment. Incidentally, for example, a sealing body MR shaped in a rectangular form is seen through in FIG. 11. In FIG. 11, the semiconductor device SA1 in the present embodiment first has the sealing body MR shaped in the rectangular form. The sealing body MR has a side S1, a side S2 opposite to the side S1, a side S3 crossing the sides S1 and S2, and a side S4 opposite to the side S3. A back surface (first surface) is formed by these sides S1 to S4. That is, FIG. 11 is a plan view as viewed from the back surface of the sealing body MR. A surface opposite to the back surface corresponds to a front surface (second surface), and surfaces interposed between the back surface and the front surface correspond to side surfaces (four surfaces). At this time, it can be said that when the semiconductor device SA1 is mounted over a mounting substrate, the back surface of the sealing body MR corresponds to the surface opposite to the surface of the mounting substrate over which the semiconductor device SA1 is mounted.

Next, the semiconductor device SA1 in the present embodiment has a chip mounting portion TAB1, a chip mounting portion TAB2, a chip mounting portion TAB3, and a chip mounting portion TAB4 arranged so as to be aligned in a −x direction. Further, the chip mounting portions TAB1 to TAB4 are respectively electrically coupled to leads LD2 and formed integrally with the leads LD2. The leads LD2 protrude from the second side (side surface) of the sealing body MR. In addition to the leads LD2 respectively formed integrally with the chip mounting portions TAB1 to TAB4, for example, ground leads (leads L2) capable of supplying a GND potential (ground potential) are also included in a plurality of leads LD. That is, reference numerals 18 to 25 shown in FIG. 11 respectively configure the leads LD2. In particular, reference numerals 18 to 20 respectively indicate the ground leads, reference numeral 21 indicates the lead LD2 coupled to the W phase, reference numeral 22 indicates the lead LD2 coupled to the V phase, and reference numeral 23 indicates the lead LD2 coupled to the U phase. Further, reference numeral 24 indicates the lead LD2 capable of supplying a power supply potential, and reference numeral 25 is a non-connect lead electrically discoupled from any part.

On the other hand, a chip mounting portion TAB5 is arranged so as to be aligned with the chip mounting portion TAB1 on the +y-direction side of the chip mounting portion TAB1. Also, the chip mounting portion TAB5 is fixed by leads LD1 (reference numerals 1 and 17). Further, as shown in FIG. 11, for example, a plurality of leads LD1 protrude from the side S1 of the sealing body MR. The seventeen leads LD1 designated at reference numerals 1 to 17 are provided in FIG. 11.

Thus, when viewed from the back surface side of the sealing body MR, the chip mounting portion TAB2 is arranged so as to be interposed between the chip mounting portion TAB1 and the chip mounting portion TAB3 in the direction (+x direction) in which the side S1 of the sealing body MR extends, and the chip mounting portion TAB3 is arranged so as to be interposed between the chip mounting portion TAB2 and the chip mounting portion TAB4 in the direction (+x direction). Further, when viewed from the back surface side of the sealing body MR, the chip mounting portion TAB5 is arranged so as to be closer to the chip mounting portion TAB1 than the chip mounting portion TAB4.

When viewed from the back surface side of the sealing body MR here, the leads LD1 are arranged along the side S1 of the sealing body MR, and the leads LD2 are arranged along the side S2 of the sealing body MR. Further, the semiconductor device SA1 in the present embodiment has a relay lead RL1 and a relay lead L2 inside the sealing body MR. When viewed from the back surface side of the sealing body MR, the relay lead RL1 is arranged over the side S3 of the sealing body MR and extends toward the inside (central part) of the sealing body MR. Likewise, when viewed from the back surface side of the sealing body MR, the relay lead RL2 is arranged over the side S4 of the sealing body MR and extends toward the inside (central part) of the sealing body MR. To say more precisely, when viewed from the back surface side of the sealing body MR, the relay leads RL1 and RL2 are arranged so as to be closer to the side S1 than the side S2 of the sealing body MR. Further, when planarly viewed from the back surface side of the sealing body MR, part of the relay lead RL1 is arranged so as to be interposed between the chip mounting portion TAB1 and the chip mounting portion TAB5, and each wire W1 overlaps with the part of the relay lead RL1.

Subsequently, as shown in FIG. 11, a semiconductor chip CHP1 (HU) formed with a high side IGBT corresponding to the U phase, a semiconductor chip CHP1 (HV) formed with a high side IGBT corresponding to the Vphase, and a semiconductor chip CHP1 (HW) formed with a high side IGBT corresponding to the W phase are mounted over the back surface of the chip mounting portion TAB1. Further, semiconductor chips CHP2 (HU), CHP2 (HV), and CHP2 (HW) respectively formed with diodes are also mounted over the chip mounting portion TAB1.

Likewise, a semiconductor chip CHP1 (LU) formed with a low side IGBT corresponding to the U phase, and a semiconductor chip CHP2 (LU) formed with a diode are mounted over the chip mounting portion TAB2. Besides, a semiconductor chip CHP1 (LV) formed with a low side IGBT corresponding to the V phase, and a semiconductor chip CHP2 (LV) formed with a diode are mounted over the chip mounting portion TAB3. Further, a semiconductor chip CHP1 (LW) formed with a low side IGBT corresponding to the W phase, and a semiconductor chip CHP2 (LW) formed with a diode are mounted over the chip mounting portion TAB4.

Then, as shown in FIG. 11, the IGBT chip mounted over each of the chip mounting portions TAB1 to TAB4 is provided with an IGBT (power transistor) and has a surface over which a gate electrode pad (control electrode pad) electrically coupled to a gate electrode (control electrode) of the IGBT. It can be said that the surface of the IGBT chip corresponds to the surface opposite to the back surface of the sealing body MR. On the other hand, a semiconductor chip CHP3 (semiconductor chip for control) mounted over the chip mounting portion TAB5 is equipped with a gate control circuit which controls the gate electrode of the IGBT formed in each IGBT chip, and has a surface over which an electrode pad electrically coupled to the gate control circuit is disposed. It can be said that the surface of the semiconductor chip CHP3 corresponds to the surface opposite to the back surface of the sealing body MR.

At this time, the semiconductor chip CHP3 and the leads LD1 are electrically coupled through wires W1, whereas the IGBT chips and the leads LD2 are electrically coupled by wires W2 through the diode chips. Here, the wire W1 is formed of, for example, a gold wire or a copper wire, whereas the wire W2 is formed of, for example, an aluminum wire. The diameter of the wire W1 is thinner than that of the wire W2. As a concrete example, the diagram of the wire W1 is about 30 μm or so, and the diameter of the wire W2 is about 300 μm or so.

As shown in FIG. 11, in the present embodiment, the electrode pad of the semiconductor chip CHP3, and the gate electrode pad of the semiconductor chip CHP1 (HU) are directly coupled to each other by the wire W1, and the electrode pad of the semiconductor chip CHP3 and an emitter electrode pad of the semiconductor chip CHP1 (HU) are directly coupled to each other by the wire W1. Further, the electrode pad of the semiconductor chip CHP3 and the gate electrode pad of the semiconductor chip CHP1 (HV) are directly coupled by the wire W1, and the electrode pad of the semiconductor chip CHP3 and an emitter electrode pad of the semiconductor chip CHP1 (HV) are directly coupled by the wire W1. Likewise, the electrode pad of the semiconductor chip CHP3 and the gate electrode pad of the semiconductor chip CHP1 (HW) are directly coupled by the wire W1, and the electrode pad of the semiconductor chip CHP3 and an emitter electrode pad of the semiconductor chip CHP1 (HW) are directly coupled by the wire W1.

Further, in the present embodiment, the electrode pad of the semiconductor chip CHP3 and the gate electrode pad of the semiconductor chip CHP1 (LU) are directly coupled by the wire W1. Also, the electrode pad of the semiconductor chip CHP3 and the relay lead RL1 are coupled by a wire W1*a*. The relay lead RL1 and the gate electrode pad of the semiconductor chip CHP1 (LV) are coupled by a wire W1*b*. That is, the gate electrode pad of the semiconductor chip CHP1 (LV) and the electrode pad of the semiconductor chip CHP3 are electrically coupled by the wire W1*a* and the wire W1*b* through the relay lead RL1.

If described in more detail, one end of the wire W1*a* is electrically coupled to the electrode pad of the semiconductor chip CHP3, and the other end thereof located on the side opposite to one end of the wire W1*a* is electrically coupled to the relay lead RL1. Further, one end of the wire W1*b* is electrically coupled to the relay lead RL1, and the other end thereof located on the side opposite to one end of the wire W1b is electrically coupled to the gate electrode pad of the semiconductor chip CHP1 (LV).

Likewise, the electrode pad of the semiconductor chip CHP3 and the relay lead RL2 are coupled by a wire W1c. The relay lead RL2 and the gate electrode pad of the semiconductor chip CHP1 (LW) are coupled by a wire W1d. That is, the gate electrode pad of the semiconductor chip CHP1 (LW) and the electrode pad of the semiconductor chip CHP3 are electrically coupled by the wire W1c and the wire W1d through the relay lead RL2.

If described in more detail, one end of the wire W1c is electrically coupled to the electrode pad of the semiconductor chip CHP3, and the other end thereof located on the side opposite to one end of the wire W1c is electrically coupled to the relay lead RL2. Further, one end of the wire W1d is electrically coupled to the relay lead RL2, and the other end thereof located on the side opposite to one end of the wire W1d is electrically coupled to the gate electrode pad of the semiconductor chip CHP1 (LW).

Next, as shown in FIG. 11, the emitter electrode pad of the semiconductor chip CHP1 (HU) is electrically coupled to the lead LD2 (reference numeral 23) through an anode electrode pad of the semiconductor chip CHP2 (HU). The emitter electrode pad of the semiconductor chip CHP1 (HV) is electrically coupled to the lead LD2 (reference numeral 22) through an anode electrode pad of the semiconductor chip CHP2 (HV). Further, the emitter electrode pad of the semiconductor chip CHP1 (HW) is electrically coupled to the lead LD2 (reference numeral 21) through an anode electrode pad of the semiconductor chip CHP2 (HW).

Further, an emitter electrode pad of the semiconductor chip CHP1 (LU) is electrically coupled to the lead LD2 (ground lead designated at reference numeral 20) through an anode electrode pad of the semiconductor chip CHP2 (LU). An emitter electrode pad of the semiconductor chip CHP1 (LV) is electrically coupled to the lead LD2 (ground lead designated at reference numeral 19) through an anode electrode pad of the semiconductor chip CHP2 (LV). Moreover, an emitter electrode pad of the semiconductor chip CHP1 (LW) is electrically coupled to the lead LD2 (ground lead designated at reference numeral 18) through an anode electrode pad of the semiconductor chip CHP2 (LW).

Subsequently, in FIG. 11, the respective parts of the leads LD1, which are exposed from the side S1 of the sealing body MR configure external terminals couplable to terminals of the mounting board when the semiconductor device SA1 is mounted over the mounting board. Likewise, the respective parts of the leads LD2, which are exposed from the side S2 of the sealing body MR configure external terminals couplable to terminals of the mounting board when the semiconductor device SA1 is mounted over the mounting board. On the other hand, as shown in FIG. 11, the relay lead RL1 extends in the +x direction while having a bent portion BP and is cut in the vicinity of the side surface including the side S3 of the sealing body MR. Likewise, the relay lead RL2 extends in the −x direction while having a bent portion BP and is cut in the vicinity of the side surface including the side S4 of the sealing body MR. Thus, it can be said that the structure of the part of the relay lead RL1, which is exposed from the sealing body MR is different from that of each of the parts of the leads LD1 and LD2, which are exposed from the sealing body MR. Likewise, it can be said that the structure of the part of the relay lead RL2, which is exposed from the sealing body MR is different from that of each of the parts of the leads LD1 and LD2, which are exposed from the sealing body MR. Described specifically, the length of the part of the relay lead RL1, which protrudes from the sealing body MR is shorter than that of each of the parts of the leads LD1 and LD2, which protrude from the sealing body MR. Likewise, the length of the part of the relay lead RL2, which protrudes from the sealing body MR is shorter than that of each of the parts of the leads LD1 and LD2, which protrude from the sealing body MR.

Figure 12:
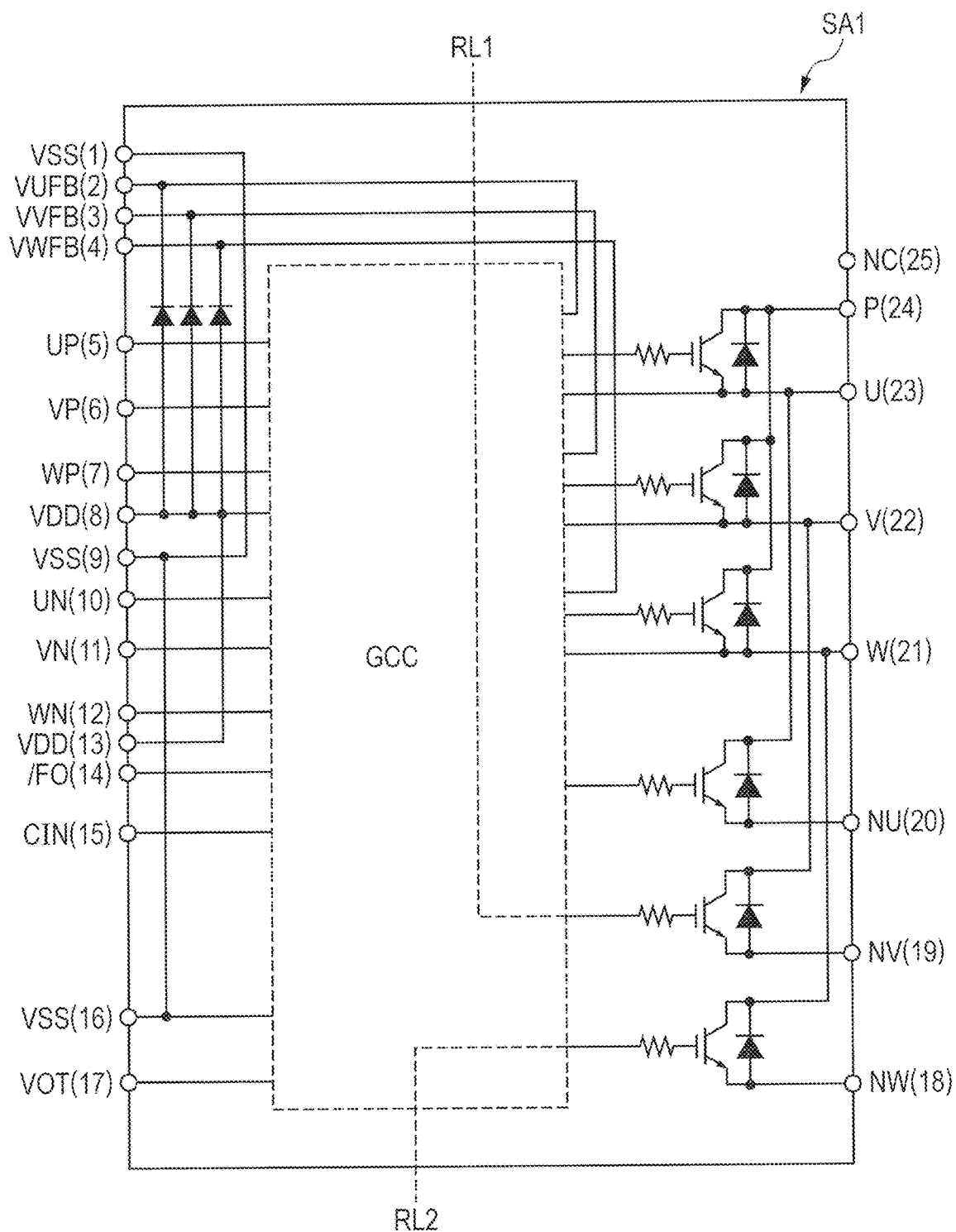
FIG. 12 is a diagram showing a correspondence relation between terminals and circuit elements (six IGBTs and six diodes which configure gate control circuits and three-phase inverter circuit) of the semiconductor device according to the embodiment.

Next, FIG. 12 is a diagram showing a correspondence relation between the terminals and circuit elements (six IGBTs and six diodes which configure the gate control circuits GCC and three-phase inverter circuit) of the semiconductor device SA1 according to the present embodiment. In FIG. 12, the names of the terminals are described, and the (numbers) described after the names correspond to the numbers assigned to the leads LD1 and the leads LD shown in FIG. 11. Thus, it is understood that in the semiconductor device SA1 according to the present embodiment, twenty-five terminals (leads LD1+leads LD2) exist in the upper and lower sides in total, and the relay lead RL1 and the relay lead RL2 exist in the left and right sides.

Features in the Embodiment

Feature points in the present embodiment will subsequently be described. The first feature point in the present embodiment resides in that as shown in FIG. 11, for example, the chip mounting portion TAB5 over which the semiconductor chip CHP3 is mounted is arranged with being shifted from the central position in the +x direction. That is, the first feature point in the present embodiment resides in that the chip mounting portion TAB5 is arranged so as to be closer to the chip mounting portion TAB1 than the chip mounting portions TAB2 to TAB4. Thus, the distance between the semiconductor chip CHP3 mounted over the chip mounting portion TAB5 and each of the semiconductor chip CHP1 (HU), the semiconductor chip CHP1 (HV) and the semiconductor chip CHP1 (HW) mounted over the chip mounting portion TAB1 can be made closer. This means that the length of the wire W1 which electrically couples each of the semiconductor chip CHP1 (HU), the semiconductor chip CHP1 (HV) and the semiconductor chip CHP1 (HW), and the semiconductor chip CHP3 can be made short. As a result, according to the present embodiment, it is possible to suppress a wire flow and increases in parasitic resistance and inductance due to the length of the wire W1 being increased. From this point, according to the first feature point in the present embodiment, it is possible to achieve an improvement in the reliability of the semiconductor device SA1 and an improvement in the electrical characteristics of the semiconductor device.

In particular, the present embodiment has large technical significance in that the chip mounting portion TAB5 is shifted to the chip mounting portion TAB1 side (+x direction side) without being shifted to the chip mounting portion TAB4 side (−x direction side) That is, the semiconductor chip CHP1 (HU), the semiconductor chip CHP1 (HV), and the semiconductor chip CHP1 (HW) each formed with the high side IGBT are mounted over the chip mounting portion TAB1. Further, as shown in FIG. 11, each of the semiconductor chip CHP1 (HU), the semiconductor chip CHP1 (HV) and the semiconductor chip CHP1 (HW), and the semiconductor chip CHP3 are electrically coupled by the two wires W1.

For example, when attention is paid to the semiconductor chip CHP1 (HU) mounted over the chip mounting portion TAB1, the gate electrode pad of the semiconductor chip CHP1 (HU) and the pad of the semiconductor chip CHP3 are electrically coupled to each other. Further, the emitter electrode pad of the semiconductor chip CHP1 (HU) and another pad of the semiconductor chip CHP3 are electrically coupled to each other. This is because there are needs to, as shown in FIG. 6, couple the gate control circuit GCC and the gate electrode of the high side IGBT (HQ1) in order to control the ON/OFF operation of the high side IGBT (HQ1) by the gate control circuit GCC, and to electrically couple the gate control circuit GCC and the emitter of the high side IGBT (HQ1) in order to take in the potential as the reference. That is, the two wires W1 different from each other are required for the electrical coupling of the semiconductor chip CHP3 formed with the gate control circuit GCC and the semiconductor chip CHP1 (HU) formed with the high side IGBT (HQ1). Thus, each of the semiconductor chip CHP1 (HU), the semiconductor chip CHP1 (HV) and the semiconductor chip CHP1 (HW) mounted over the chip mounting portion TAB1, and the semiconductor chip CHP3 are required to be coupled to each other by the two wires W1 respectively. The six wires W1 in total are required.

On the other hand, when attention is paid to the semiconductor chip CHP1 (LU) mounted over the chip mounting portion TAB2, the gate electrode pad of the semiconductor chip CHP1 (LU) and the pad of the semiconductor chip CHP3 are merely electrically coupled to each other, and the emitter electrode pad of the semiconductor chip CHP1 (LU) and the semiconductor chip CHP3 are not electrically coupled to each other. This is because as shown in FIG. 6, the gate control circuit GCC and the gate electrode of the low side IGBT (LQ1) may simply be coupled to control the ON/OFF operation of the low side IGBT (LQ1) by the gate control circuit GCC. That is, this is because since the gate control circuit GCC and the emitter of the low side IGBT (LQ1) are both supplied with the GND potential (ground potential), it is not necessary to dare to couple the gate control circuit GCC with the emitter of the low side IGBT (LQ1), and the substrate potential (GND potential) of the semiconductor chip CHP3 itself may simply be used as a reference potential.

From this point of view, one wire W1 is enough to electrically couple the semiconductor chip CHP3 formed with the gate control circuit GCC and the semiconductor chip CHP1 (LU) formed with the low side IGBT (LQ1). Thus, one wire W1 is used for coupling between each of the semiconductor chip CHP1 (LU), the semiconductor chip CHP1 (LV) and the semiconductor chip CHP1 (LW) each formed with the low side IGBT (LQ1) and the semiconductor chip CHP3 formed with the gate control circuit GCC, and hence the three wires W1 are required in total.

From the above, the six wires W1 are needed in total to couple the semiconductor chip CHP1 (HU), the semiconductor chip CHP1 (HV) and the semiconductor chip CHP1 (HW) each formed with the high side IGBT, and the semiconductor chip CHP3. On the other hand, the three wires W1 are needed in total to couple the semiconductor chip CHP1 (LU), the semiconductor chip CHP1 (LV) and the semiconductor chip CHP1 (LW) each formed with the low side IGBT, and the semiconductor chip CHP3. Thus, in the case of the configuration in which the chip mounting portion TAB5 over which the semiconductor chip CHP3 is mounted is shifted to the chip mounting portion TAB1 side (+x direction side), the lengths of the six wires W1 can be shortened, whereas in the case of the configuration in which the chip mounting portion TAB5 over which the semiconductor chip CHP3 is mounted is shifted to the chip mounting portion TAB4 side (−x direction side), only the three wires W1 can be shortened in length. That is, when the configuration in which the chip mounting portion TAB5 over which the semiconductor chip CHP3 is mounted is shifted to the chip mounting portion TAB1 side (+x direction side) is adopted as in the present embodiment, the number of the wires W1 whose lengths can be shortened can be increased. That is, in terms of the lengths of the wires W1 as much as possible being effectively shortened, the configuration in which the chip mounting portion TAB5 is shifted to the chip mounting portion TAB1 side (+x direction side) is advantageous as compared with the configuration in which the chip mounting portion TAB5 is shifted to the chip mounting portion TAB4 side (−x direction side) From this point of view, the configuration in which the chip mounting portion TAB5 is shifted to the chip mounting portion TAB1 side mounted with the semiconductor chip CHP1 (HU), the semiconductor chip CHP1 (HV), and the semiconductor chip CHP1 (HW) each formed with the high side IGBT has large technical significance in that shortening of the lengths of the wires W1 as much as possible can be realized.

The configuration in which the chip mounting portion TAB5 is shifted to the chip mounting portion TAB1 side mounted with the semiconductor chip CHP1 (HU), the semiconductor chip CHP1 (HV) and the semiconductor chip CHP1 (HW) each formed with the high side IGBT becomes advantageous in the following points. That is, when attention is paid to the semiconductor chip CHP1 (HU), the advantageous configuration is brought about because the semiconductor chip CHP1 (HU) and the semiconductor chip CHP3 are coupled to each other by the two wires W1. In other words, the advantageous configuration is brought about because besides coupling the gate electrode pad of the semiconductor chip CHP1 (HU) and the pad of the semiconductor chip CHP3 by the wire W1, the emitter electrode pad of the semiconductor chip CHP1 (HU) and another pad of the semiconductor chip CHP3 are coupled by the wire W1.

On the other hand, as shown in FIG. 6, the emitter of the high side IGBT is identical in potential to the collector of the low side IGBT. From this, for example, the chip mounting portion TAB2 electrically coupled to the collector formed in the back surface of the semiconductor chip CHP1 (LU) and the semiconductor chip CHP3 may be coupled by the wire W1 instead of the emitter electrode pad of the semiconductor chip CHP1 (HU) and the pad of the semiconductor chip CHP3 being coupled by the wire W1. Likewise, the chip mounting portion TAB3 and the semiconductor chip CHP3 are coupled by the wire W1, and the chip mounting portion TAB4 and the semiconductor chip CHP3 are coupled by the wire W1.

In this case, when the configuration in which the chip mounting portion TAB5 over which the semiconductor chip CHP3 is mounted is shifted to the chip mounting portion TAB4 side (−x direction side) is adopted contrary to the present embodiment, it is possible to increase the number of wires W1 whose lengths can be shortened. Thus, in the case of the configuration in which each of the chip mounting portions TAB2 to TAB4 and the semiconductor chip CHP3 are coupled by the wire W1, the configuration in which the chip mounting portion TAB5 is shifted to the chip mounting portion TAB4 side (−x direction side) is advantageous as compared with the configuration in which the chip mounting portion TAB5 is shifted to the chip mounting portion TAB1 side (+x direction side), in terms of the lengths of the wires W1 as much as possible being effectively shortened.

Next, return to the configuration in the present embodiment shown in FIG. 11. The length of the wire W1 which electrically couples each of the semiconductor chip CHP1 (HU), the semiconductor chip CHP1 (HV) and the semiconductor chip CHP1 (HW) and the semiconductor chip CHP3 can be shortened by the first feature point that the chip mounting portion TAB5 is shifted to the chip mounting portion TAB1 side (+x direction side). On the other hand, side effects occur in that the length of the wire W1 which couples the semiconductor chip CHP1 (LV) mounted over the chip mounting portion TAB3, and the semiconductor chip CHP3, and the length of the wire W1 which couples the semiconductor chip CHP1 (LW) mounted over the chip mounting portion TAB4, and the semiconductor chip CHP3 become long. Thus, the present embodiment has a second feature point shown below to solve the side effects due to the first feature point described above. The second feature point in the present embodiment will be described below.

The second feature point in the present embodiment resides in that as shown in FIG. 11, for example, the semiconductor chip CHP3 and the relay lead RL1 are coupled to each other by the wire W1$a$, and the relay lead RL1 and the gate electrode pad of the semiconductor chip CHP1 (LV) are coupled to each other by the wire W1$b$. That is, the second feature point in the present embodiment resides in that the semiconductor chip CHP3 and the semiconductor chip CHP1 (LV) are indirectly coupled to each other through the relay lead RL1 without directly coupling the semiconductor chip CHP3 and the semiconductor chip CHP1 (LV) by the wire.

Thus, according to the second feature point in the present embodiment, the lengths of the wires W1$a$ and W1$b$ can be shortened by interposing the relay lead RL1 therebetween as compared with the configuration in which the semiconductor chip CHP3 and the semiconductor chip CHP1 (LV) are directly coupled by the wire W1. Likewise, in the present embodiment, the technical idea that the relay lead RL1 is interposed between the semiconductor chip CHP3 and the semiconductor chip CHP1 (LV) for the coupling between the semiconductor chip CHP3 and the semiconductor chip CHP1 (LV) is applied even to the coupling between the semiconductor chip CHP3 and the semiconductor chip CHP1 (LW). Specifically, as shown in FIG. 11, the semiconductor chip CHP3 and the relay lead RL2 are coupled by the wire W1$c$, and the relay lead RL2 and the gate electrode pad of the semiconductor chip CHP1 (LW) are coupled by the wire W1$d$. It is thus possible to shorten the lengths of the wires W1$c$ and W1$d$.

For example, in the configuration that the semiconductor chip CHP3 and the semiconductor chip CHP1 (LV) are directly coupled by the wire W1, there is concern that as a result of an increase in the length of the wire W1, a wire flow, a parasitic resistance, and a parasitic inductance will increase. On the other hand, according to the second feature point in the present embodiment, the lengths of the wire W1$a$ itself and the wire W1$b$ itself can be shortened by using the wire W1$a$, the relay lead RL1, and the wire W1$b$ for the coupling between the semiconductor chip CHP3 and the semiconductor chip CHP1 (LV). This means that the increases in the wire flow, parasitic resistance and parasitic inductance can be suppressed. Particularly since the relay lead RL1 is larger than the wire W1$a$ and the wire W1$b$ in width and sectional area, the relay lead RL1 is lower in parasitic resistance and inductance than the wire. From this point, according to the second feature point in the present embodiment, it is possible to achieve an improvement in the reliability of the semiconductor device and an improvement in the electrical characteristics of the semiconductor device by the synergetic effect of the effect that the wire W1$a$ itself and the wire W1$b$ itself are shortened in length and the effect that the relay lead RL1 lower in parasitic resistance and inductance than the wire is used. Incidentally, the wire W1$c$, the relay lead RL2, and the wire W1$d$ are used even for coupling between the semiconductor chip CHP3 and the semiconductor CHP1 (LW). Therefore, even in this configuration, it is possible to achieve an improvement in the reliability of the semiconductor device and an improvement in the electrical characteristics of the semiconductor device by the synergetic effect of the effect that the lengths of the wire W1$c$ itself and the wire W1$d$ itself can be shortened, and the effect that the relay lead RL2 lower in parasitic resistance and inductance than the wire is used.

From the above, all the lengths of the wires (wires W1, W1$a$, W1$b$, W1$c$, and W1$d$) which couple the semiconductor chip CHP3 formed with the gate control circuit and the six IGBT chips can be shortened by combining the first feature point and the second feature point in the present embodiment. As a result, according to the semiconductor device SA1 in the present embodiment, the increases in the wire flow, the parasitic resistance and the parasitic inductance can be suppressed. Thus, it is possible to achieve an improvement in the reliability of the semiconductor device SA1 and an improvement in the electrical characteristics thereof.

Subsequently, the third feature point in the present embodiment resides in that the components already existing in the semiconductor device SA1 are used as the relay lead RL1 and the relay lead RL2.

According to the third feature point in the present embodiment, a design change can be reduced by diverting the existing components as the relay lead RL1 and the relay lead RL2 as compared with addition of new components nonexistent in the existing semiconductor device SA1. Further, it is possible to reduce the manufacturing cost because there is no need to add new members.

In particular, in the present embodiment, the conductive members which function as suspension leads (support leads) for fixing the sealing body MR during the manufacturing process are used as the relay lead RL1 and the relay lead RL2. That is, the relay lead RL1 and the relay lead RL2 in the present embodiment shown in FIG. 11 are the remains of the conductive members used as the suspension leads during the manufacturing process. Further, in the present embodiment, the conductive members are devised on a layout basis so as to function as the relay lead RL1 and the relay lead RL2 in the present embodiment.

Specifically, the relay lead RL1 extends inside the sealing body MR from the side S3 of the sealing body MR. In particular, the relay lead RL1 has the bent portion BP. Thus, even while the part of the relay lead RL1 exposed from the sealing body MR is placed in the position closer to the side S1 of the sealing body MR at which the leads LD1 are exposed, than the side S2 of the sealing body MR at which the leads LD2 are exposed, the relay lead RL1 can be extended to the neighborhood of the chip mounting portion TAB3 by passing through between the chip mounting portion TAB5 and the chip mounting portion TAB1.

Similarly, the relay lead RL2 extends inside the sealing body MR from the side S4 of the sealing body MR. In particular, the relay lead RL2 also has the bent portion BP. Thus, even while the part of the relay lead RL2 exposed from the sealing body MR is placed in the position closer to the side S1 of the sealing body MR at which the leads LD1 are exposed, than the side S2 of the sealing body MR at which the leads LD2 are exposed, the relay lead RL2 can be disposed close to the chip mounting portion TAB4 and can be extended to the neighborhood of the chip mounting portion TAB5.

Further, the relay lead RL1 is coupled to the semiconductor chip CHP3 through the wire W1a and coupled to the semiconductor chip CHP1 (LV) through the wire W1b. On the other hand, the relay lead RL2 is coupled to the semiconductor chip CHP3 through the wire W1c and coupled to the semiconductor chip CHP1 (LW) through the wire W1d. Since the relay lead RL1 and the relay lead RL2 configure electrical paths different from each other, they are arranged so as to be electrically isolated from each other.

The relay lead RL1 and the relay lead RL2 in the present embodiment have a plurality of characteristic structures shown below according to the third feature point that the conductive members which function as the suspension leads (support leads) for fixing the sealing body MR during the manufacturing process are diverted without using the leads LD1 and LD2.

That is, the first feature structure of the relay lead RL1 and the relay lead RL2, which is brought about by the third feature point resides in that as shown in FIG. 11, for example, the part of the relay lead RL1 (relay lead RL2) exposed from the sealing body MR has a structure different from that of each part of the leads LD1 and LD2 exposed from the sealing body MR. Specifically, since the leads LD1 and LD2 need to be electrically coupled to the terminals of the mounting board when the semiconductor device SA1 is mounted over the mounting board, the parts of the leads LD1 and LD2 exposed from the sealing body MR are formed with the external terminals couplable to the mounting board. On the other hand, the conductive member which functions as the suspension lead during the manufacturing process is diverted as for the relay lead RL1 (relay lead RL2) in the present embodiment. This suspension lead is not used for coupling between the semiconductor device SA1 and the mounting board and eventually cut. Thus, the external terminal couplable to the mounting board is not formed at the part exposed from the sealing body MR, of the relay lead RL1 (relay lead RL2) in the present embodiment which diverts the suspension lead. From this point, the part of the relay lead RL1 exposed from the sealing body MR has the structure different from that of each part of the leads LD1 and LD2 exposed from the sealing body MR. Thus, although the relay lead RL1 (relay lead RL2) in the present embodiment is not formed with the external terminal couplable to the mounting board, no particular problem occurs. This is because as shown in FIG. 11, the relay lead RL1 in the present embodiment may be interposed between the wire W1a and the wire W1b and internally have the function of electrically coupling the semiconductor chip CHP3 formed with the gate control circuit and the gate electrode pad of the semiconductor chip CHP1 (LV) formed with the low side IGBT. That is, there is no need to electrically couple the relay lead RL1 to each terminal of the mounting board. Likewise, the relay lead RL2 in the present embodiment may be interposed between the wire W1c and the wire W1d and internally have the function of electrically coupling the semiconductor chip CHP3 formed with the gate control circuit and the gate electrode pad of the semiconductor chip CHP1 (LW) formed with the low side IGBT. The relay lead RL2 is not required to be electrically coupled to each terminal of the mounting board.

Subsequently, the second characteristic structure of the relay lead RL1 and the relay lead RL2, which is brought about by the third feature point resides in that the protruded parts of the relay lead RL1 and the relay lead RL2 protrude from the side different from the side from which the protruded part of the lead LD1 and the protruded part of the lead LD2 protrude. Specifically, as shown in FIG. 11, the lead LD1 protrudes from the side S1, and the lead LD2 protrudes from the side S2, whereas the relay lead RL1 protrudes from the side S3, and the relay lead RL2 protrudes from the side S4.

Thus, it is possible to obtain advantages shown below. As shown in FIG. 11, for example, the seventeen leads LD1 are arranged along the side S1. Thus, further, when the relay lead RL1 and the relay lead RL2 are assumed to be arranged along the side S1, the number of leads arranged along the side S1 is increased from 17 to 19. This means that the length of the side S1 must be made long. For this reason, the size of the semiconductor device SA1 is increased. On the other hand, according to the present embodiment, since the relay lead RL1 and the relay lead RL2 are arranged over the sides different from the side for each lead LD1, the relay lead RL1 and the relay lead RL2 can be provided without increasing the number of the leads arranged along the side S1. Thus, according to the present embodiment, the relay lead RL1 and the relay lead RL2 can be provided without causing the increase in the size of the semiconductor device SA1.

Further, according to the present embodiment, the relay lead RL1 and the relay lead RL2 are arranged over the sides which are also different from the side for each lead LD2. Particularly since a large current for driving a load flows, an adverse effect of noise due to the large current flowing through each lead LD2 becomes easy to be exerted on the relay lead RL1 and the relay lead RL2 when the relay lead RL1 and the relay lead RL2 are arranged along the same side S2 as the leads LD2. In this respect, since the relay lead RL1 and the relay lead RL2 are arranged over the sides which are also different from the side for each lead LD2 in the present embodiment, the adverse effect of noise due to the large current flowing through each lead LD2 becomes hard to be exerted on the relay lead RL1 and the relay lead RL2. Consequently, the reliability of the semiconductor device SA1 can be improved. Further, in the present embodiment, the reliability of the semiconductor device SA1 can be enhanced even from the viewpoint that the suspension leads are diverted as the relay lead RL1 and the relay lead RL2, and provided with the bent portions BP for preventing the coming off of the suspension leads from the sealing body MR. This is because as shown in FIG. 11, as a result of the relay lead RL1 and the relay lead RL2 being formed with the bent portions BP, the protruded part of the relay lead RL1 (relay lead RL2) exposed from the sealing body MR can be arranged closer to the side S1 at which the leads LD1 are formed, than the side S2 at which the leads LD2 are formed, while arranging the extending part of the relay lead RL1 (relay lead RL2) extending inside the sealing body MR in the vicinity of the center thereof in the y direction. That is, according to the present embodiment, the adverse effect from noise due to the large current flowing through each lead LD2 can be suppressed by the synergetic effect of the relay lead RL1 and the relay lead RL2 being arranged over the sides different from the sides for the leads LD1 and LD2, and the protruded part of the relay lead RL1 (relay lead RL2) exposed from the sealing body MR being arranged so as to be away from the side S2. From the above, according to the second feature structure, the relay lead RL1 and the relay lead RL2 can be provided without causing the increase in the size of the semiconductor device and the deterioration in the electrical characteristics of the semiconductor device.

Incidentally, in the present embodiment as shown in FIG. 11, since the suspension leads for fixing the sealing body MR are diverted as the relay leads RL1 and RL2, it is inevitably often thought that from the viewpoint that they are easy to be fixed, the relay lead RL1 protrudes from the side S3, and the relay lead RL2 protrudes from the side S4 opposite to the side S3. The technical idea in the present embodiment can however be applied not only to the structure that the relay lead RL1 and the relay lead RL2 protrude from the different sides, but also to the structure that the relay lead RL1 and the relay lead RL2 protrude from the same side.

<Modification>

Figure 13:
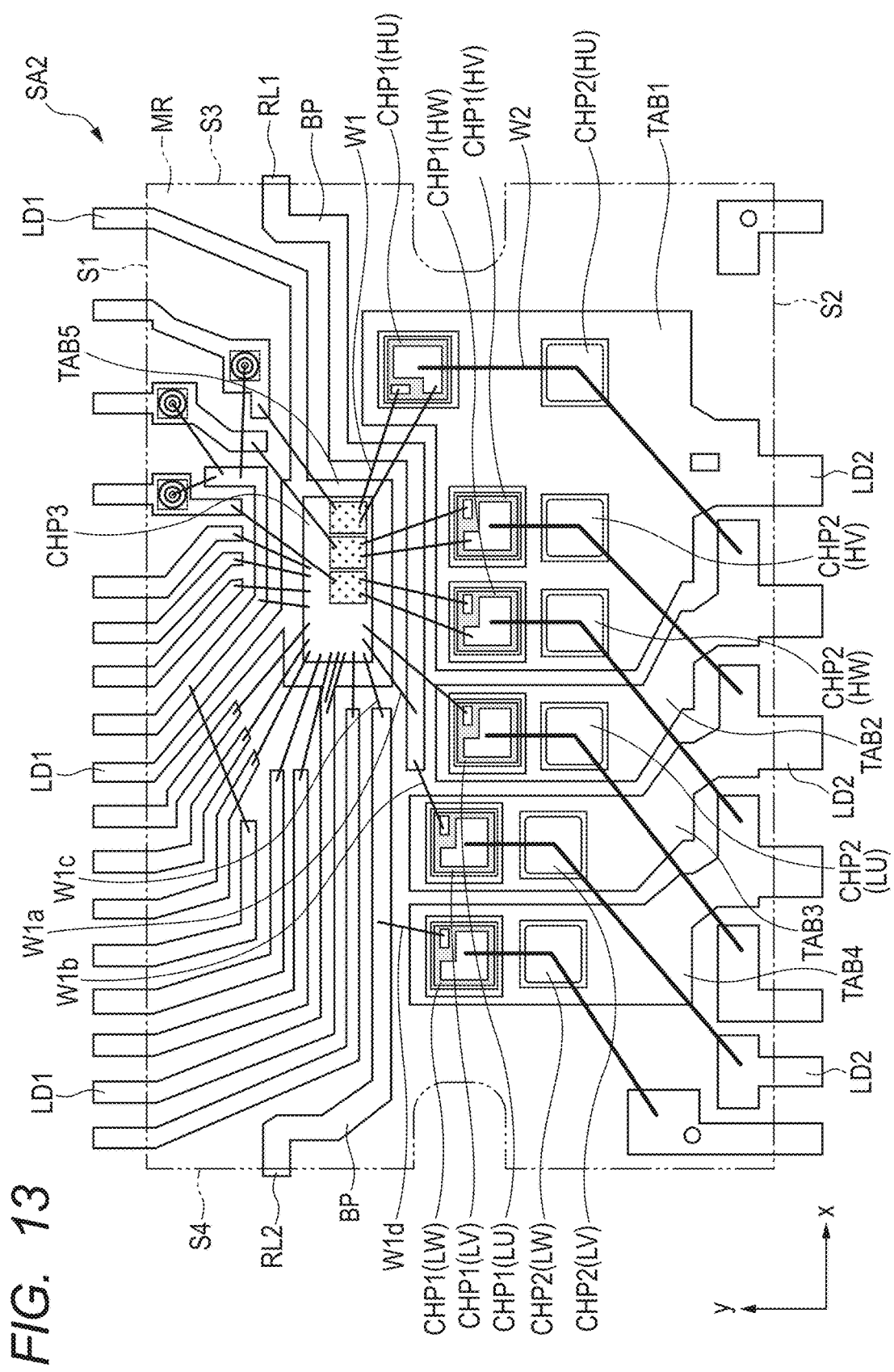
FIG. 13 is a plan view showing a typical configuration of a semiconductor device according to a modification.

FIG. 13 is a plan view showing a typical configuration of a semiconductor device SA2 according to a modification. In FIG. 13, in the semiconductor device SA2 according to the present modification, part of a chip mounting portion TAB1 is formed so as to be turned to the right side of a chip mounting portion TAB5. Then, a semiconductor chip CHP1 (HU) is mounted over the turned part of the chip mounting portion TAB1. Thus, according to the present modification, the distance between a semiconductor chip CHP3 and the semiconductor chip CHP1 (HU) can further be reduced. As a result, it is possible to shorten the length of a wire W1 which electrically couples the semiconductor chip CHP3 and the semiconductor chip CHP1 (HU).

<Manufacturing Method of Semiconductor Device According to Embodiment>

Figure 14:
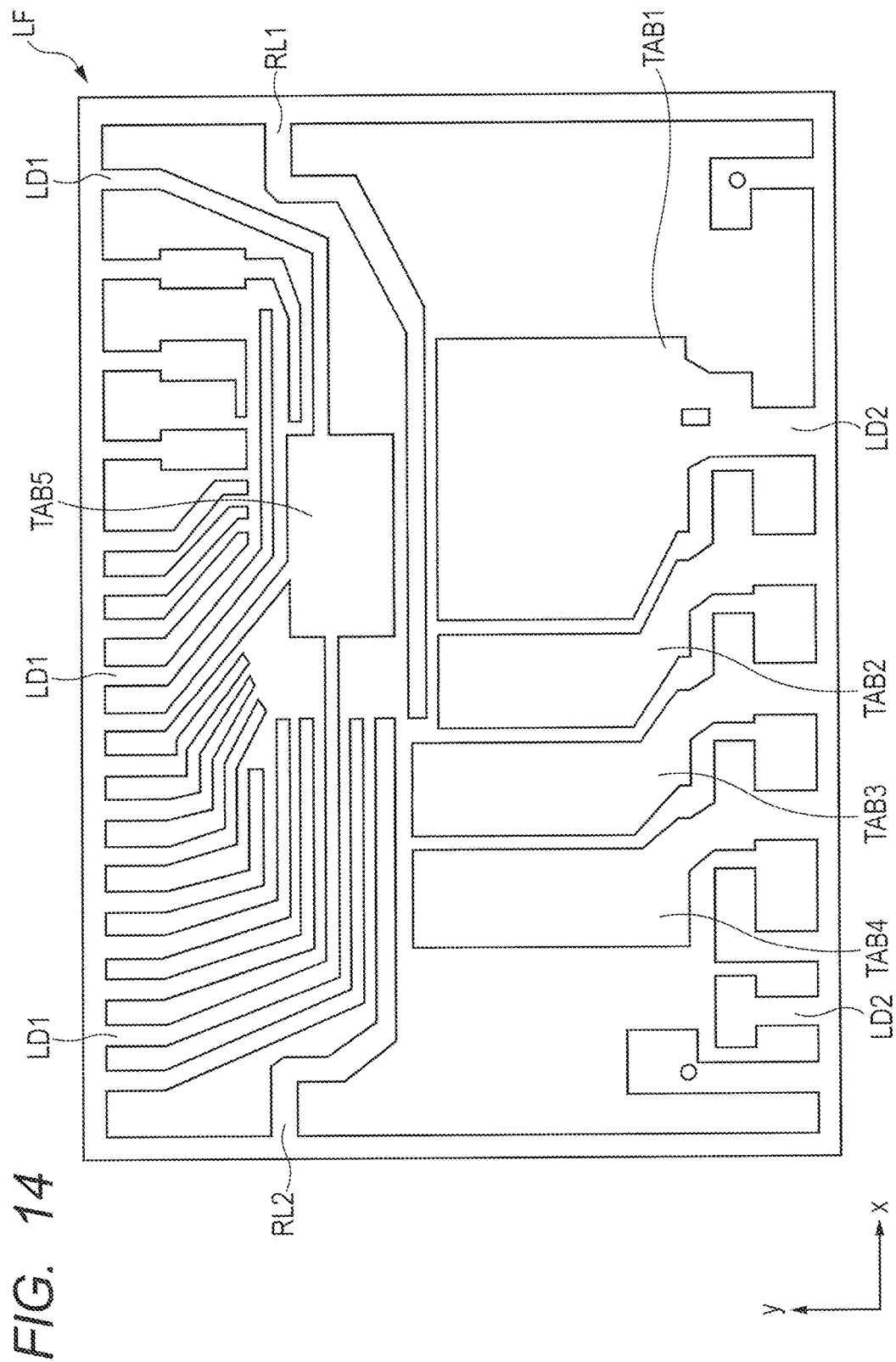
FIG. 14 is a plan view showing a manufacturing process of a semiconductor device according to an embodiment.

A manufacturing method of a semiconductor device according to the present embodiment will next be described while referring to the accompanying drawings. First, as shown in FIG. 14, for example, a lead frame LF comprised of a steel material is provided. The lead frame LF is provided with chip mounting portions TAB1 to TAB4, a plurality of leads LD1, a plurality of leads LD2, a relay lead RL1, and a relay lead RL2. At this time, part of each lead LD2 and each of the chip mounting portions TAB1 to TAB4 are formed integrally. The leads LD2 are coupled to a frame body of the lead frame LF. Further, the leads LD1 are also coupled to the frame body of the lead frame LF, and a chip mounting portion TAB5 is supported by some of the leads LD1. Moreover, the relay lead RL1 and the relay lead RL2 are separated from each other and respectively coupled to the frame body of the lead frame LF. Incidentally, as shown in FIG. 14, in the present embodiment, the chip mounting portion TAB5 is arranged shifting in a +t x direction from the position of the center of each of the chip mounting portions TAB1 to TAB4 arranged side by side in an x direction.

Figure 15:
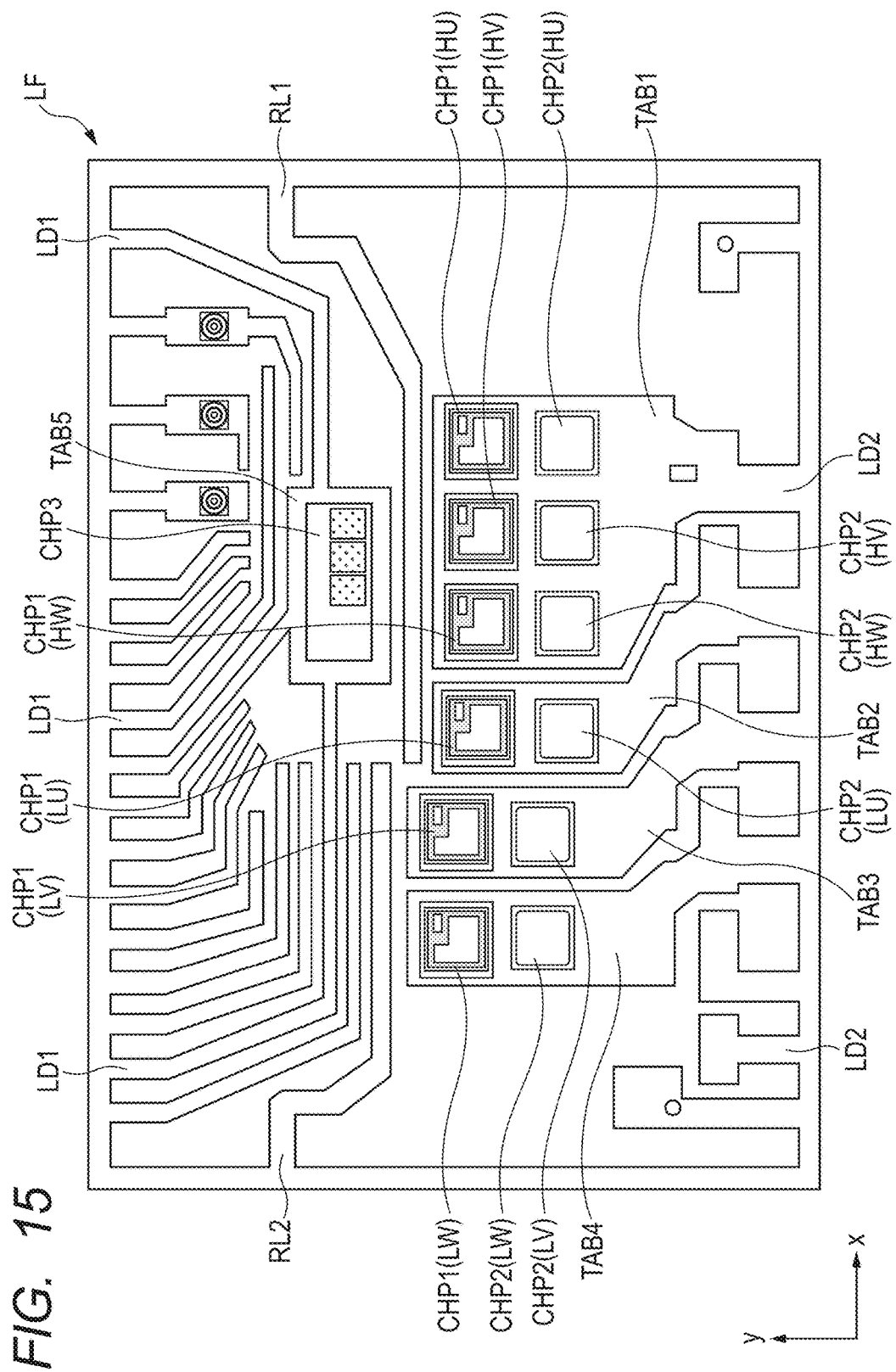
FIG. 15 is a plan view showing a manufacturing process of the semiconductor device, following FIG. 14.

Subsequently, as shown in FIG. 15, the semiconductor chip CHP1 (HU), a semiconductor chip CHP1 (HV), and a semiconductor chip CHP1 (HW) each formed with a high side IGBT are mounted over the chip mounting portion TAB1 through, for example, a conductive adhesive (high melting point solder or silver paste). Likewise, a semiconductor chip CHP2 (HU), a semiconductor chip CHP2 (HV), and a semiconductor chip CHP2 (HW) each formed with a diode are mounted over the chip mounting portion TAB1 through a conductive adhesive. Further, a semiconductor chip CHP1 (LU) formed with a low side IGBT is mounted over the chip mounting portion TAB2 through a conductive adhesive, and a semiconductor chip CHP2 (LU) formed with a diode is mounted over the chip mounting portion TAB2 therethrough. Likewise, a semiconductor chip CHP1 (LV) formed with a low side IGBT is mounted over the chip mounting portion TAB3 through a conductive adhesive, and a semiconductor chip CHP2 (LV) formed with a diode is mounted thereon therethrough. Further, a semiconductor chip CHP1 (LW) formed with a low side IGBT is mounted over the chip mounting table portion TAB4 through a conductive adhesive, and a semiconductor chip CHP2 (LW) formed with a diode is mounted thereon therethrough. A semiconductor chip CHP3 formed with a gate control circuit is mounted over the chip mounting portion TAB5 through a conductive adhesive.

Figure 16:
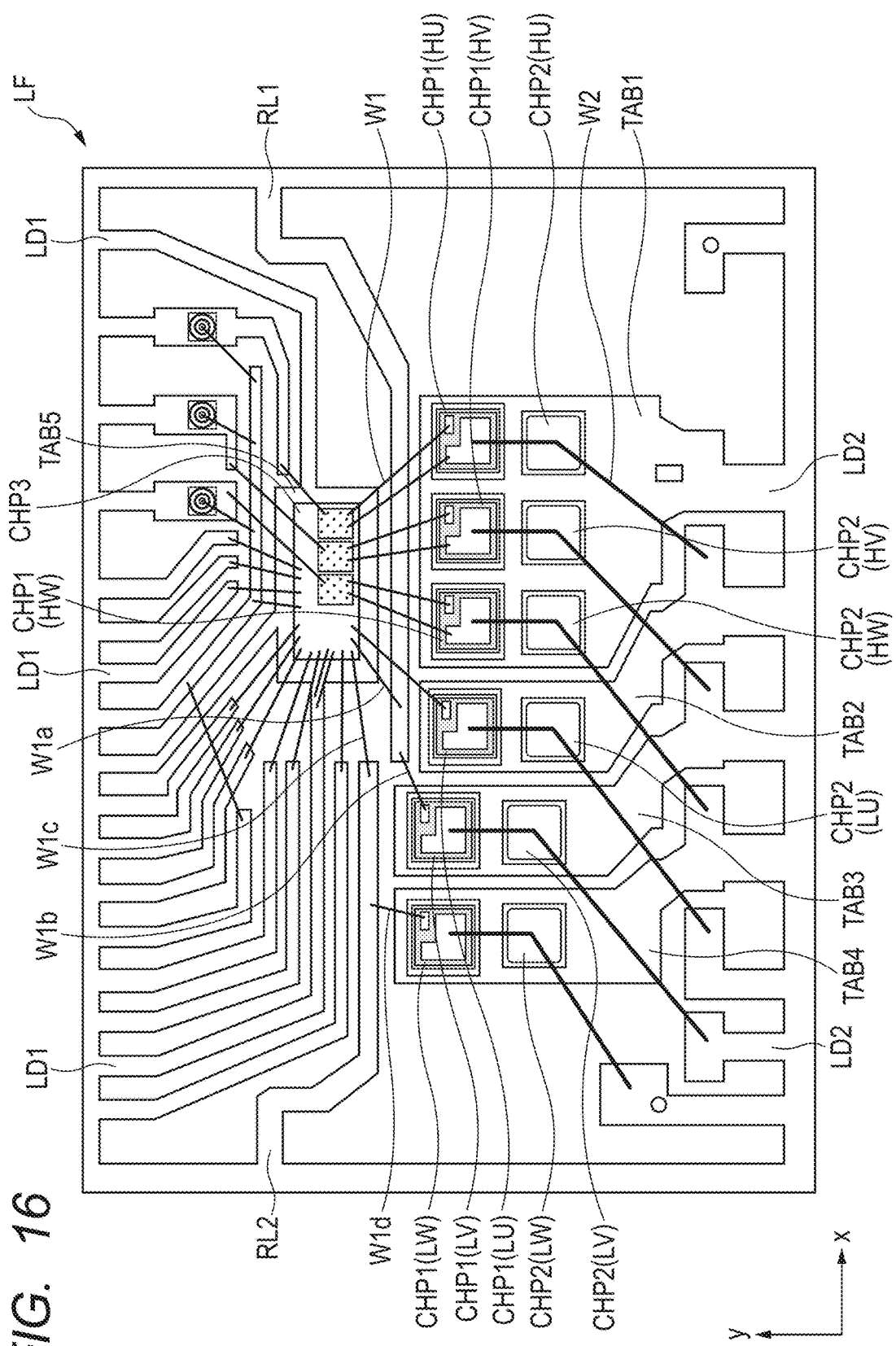
FIG. 16 is a plan view showing a manufacturing process of the semiconductor device, following FIG. 15.

Thereafter, as shown in FIG. 16, the semiconductor chip CHP3 and the leads LD1 are coupled by wires W1 each comprised of, for example, a gold wire or a copper wire, and each of the semiconductor chip CHP1 (HU), the semiconductor chip CHP1 (HV), the semiconductor chip CHP1 (HW) and the semiconductor chip CHP1 (LU), and the semiconductor chip CHP3 are coupled by wires W1. Further, in the present embodiment, the semiconductor chip CHP3 and the relay lead RL1 are coupled by a wire W1$a$, and the relay lead RL1 and the semiconductor chip CHP1 (LV) are coupled by a wire W1$b$. Likewise, the semiconductor chip CHP3 and the relay lead RL2 are coupled by a wire W1$c$, and the relay lead RL2 and the semiconductor chip CHP1 (LW) are coupled by a wire W1$d$. Thus, according to the present embodiment, the semiconductor chip CHP3 and the semiconductor chip CHP1 (LV) are indirectly coupled through the relay lead RL1, and the semiconductor chip CHP3 and the semiconductor chip CHP1 (LW) are indirectly coupled through the relay lead RL2. As a result, according to the present embodiment, the lengths of the wires W1, W1$a$, W1$b$, W1$c$, and W1$d$ can be shortened.

Further, as shown in FIG. 16, an emitter electrode pad of each IGBT chip and an anode electrode pad of each diode chip are coupled by a wire W2 comprised of, for example, an aluminum wire. Moreover, the anode electrode pad of the diode chip and the lead LD2 are coupled by the wire W2. At this time, the diameter of the wire W2 is thicker than the diameter of the wire W1.

Figure 17:
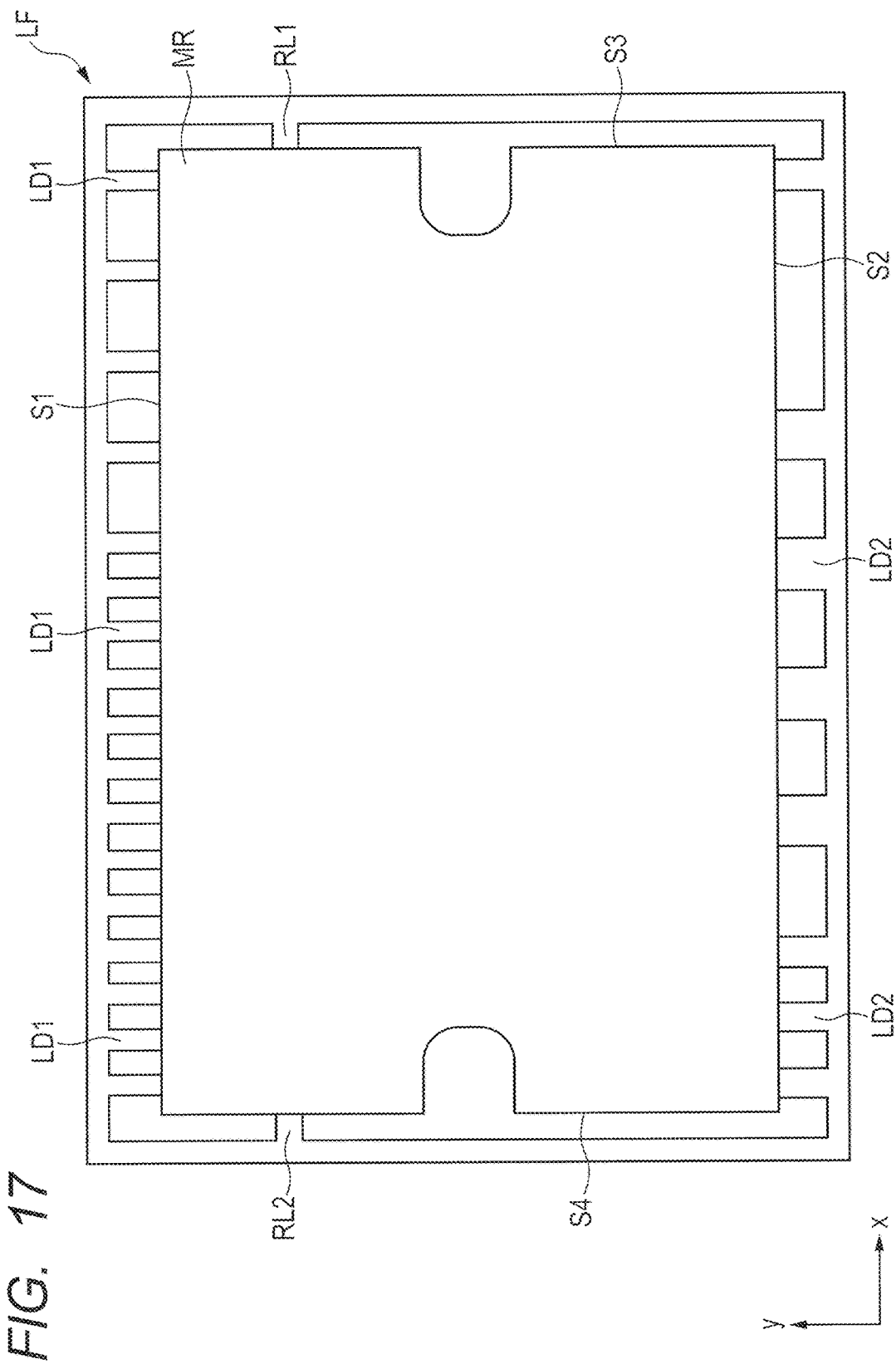
FIG. 17 is a plan view showing a manufacturing process of the semiconductor device, following FIG. 16.
Figure 18:
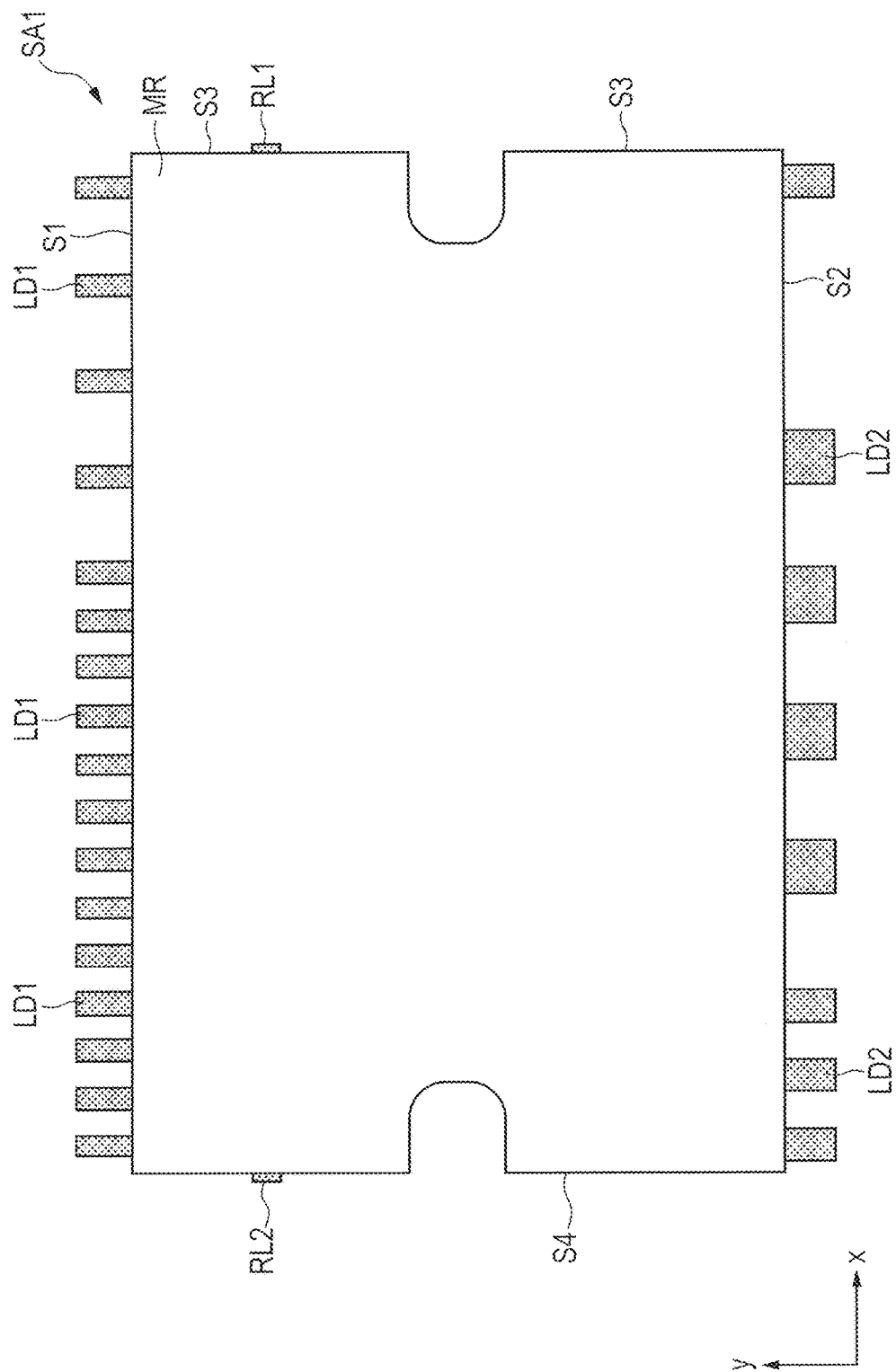
FIG. 18 is a plan view showing a manufacturing process of the semiconductor device, following FIG. 17.

Next, as shown in FIG. 17, a sealing body MR comprised of, for example, a resin is formed. Then, the leads LD1 and the leads LD2 are separated from the frame body of the lead frame LF. At this time, the sealing body MR is supported on the lead frame LF by the relay lead RL1 and the relay lead RL2. That is, the relay lead RL1 and the relay lead RL2 in the present embodiment function as the suspension leads for fixing the sealing body MR to the lead frame LF during the manufacturing process. Thereafter, as shown in FIG. 18, a plating film is formed over exposed parts of the leads LD1 and exposed parts of the leads LD2, which are exposed from the sealing body MR. Further, the semiconductor device SA1 according to the present embodiment can be manufactured by cutting the suspension leads (relay leads RL1 and RL2). In the semiconductor device SA1, the exposed parts of the leads LD1 and the exposed parts of the leads LD2 are respectively formed with external terminals couplable to a mounting board, whereas exposed parts of the relay leads RL1 and RL2 are not formed with external terminals couplable to the mounting board. That is, the exposed parts of the relay leads RL1 and RL2 are different in structure from the exposed parts of the leads LD1 and the exposed parts of the leads LD2.

Although the invention made above by the present inventors has been described specifically on the basis of the preferred embodiments, the present invention is not limited to the embodiments referred to above. It is needless to say that various changes can be made thereto within the scope not departing from the gist thereof.

Although the above embodiment has been described by taking the IGBT as the example of each power transistor which configures the three-phase inverter circuit, the technical idea in the embodiment is not limited to this, but can be applied even to a power MOSFET. Incidentally, when the power MOSFET is used as the power transistor, a body diode is built therein and functions as a free wheel diode. Therefore, unlike the IGBT, there is no need to provide an external free wheel diode.

What is claimed is:

1. A semiconductor device comprising:
    a first semiconductor chip provided with a first power transistor and having a first surface over which a first control pad electrically coupled to a first control electrode of the first power transistor is arranged;
    a second semiconductor chip provided with a second power transistor and having a second surface over which a second control pad electrically coupled to a second control electrode of the second power transistor is arranged;
    a control semiconductor chip provided with a control circuit controlling the first control electrode of the first power transistor of the first semiconductor chip and the second control electrode of the second power transistor of the second semiconductor chip, and having a surface over which a first electrode pad and a second electrode pad electrically coupled to the control circuit is arranged;
    a plurality of first leads electrically coupled to the control semiconductor chip;
    a plurality of second leads electrically coupled to the first semiconductor chip;
    a first relay lead electrically coupled to the first semiconductor chip and the control semiconductor chip; and
    a sealing body including a first surface having a first side, a second side opposite to the first side, and a third side extending in a direction intersecting with the first side and the second side, and a second surface being a surface located on the side opposite to the first surface, the sealing body sealing the first semiconductor chip, the control semiconductor chip, respective parts of the first leads, respective parts of the second leads, and a part of the first relay lead,
    wherein the first control pad of the first semiconductor chip and the first electrode pad of the control semiconductor chip are electrically coupled by a first conductive member through the first relay lead to each other,
    wherein the second control pad of the second semiconductor chip and the second electrode pad of the control semiconductor chip are directly, electrically coupled by a wire, and
    wherein a structure of a part of the first relay lead, which is exposed from the sealing body, is different from structures of respective parts of the first leads and the second leads, which are exposed from the sealing body.

2. The semiconductor device according to claim 1,
    wherein when viewed from the first surface side of the sealing body, the first leads are arranged along the first side of the sealing body,
    wherein when viewed from the first surface side of the sealing body, the second leads are arranged along the second side of the sealing body, and
    wherein when viewed from the first surface side of the sealing body, the first relay lead is arranged over the third side of the sealing body and extends to the inside of the sealing body.

3. The semiconductor device according to claim 2, wherein when viewed from the first surface side of the sealing body, the first relay lead is closer to the first side than the second side of the sealing body.

4. The semiconductor device according to claim 2, wherein the first relay lead has a bent portion.

5. The semiconductor device according to claim 2, further comprising:
    a third semiconductor chip provided with a third power transistor and having a third surface over which a third control pad electrically coupled to a third control electrode of the third power transistor is arranged; and
    a second relay lead electrically coupled to the third semiconductor chip and the control semiconductor chip,
    wherein a third electrode pad electrically coupled to the control circuit is arranged over the surface of the control semiconductor chip,
    wherein the third control pad of the third semiconductor chip and the second third electrode pad of the control semiconductor chip are electrically coupled by a second conductive member through the second relay lead to each other, and
    wherein a structure of a part of the second relay lead, which is exposed from the sealing body is different from the structures of the respective parts of the first leads and the second leads, which are exposed from the sealing body.

6. The semiconductor device according to claim 5,
    wherein the first surface of the sealing body has a fourth side opposite to the third side, and
    wherein when viewed from the first surface side of the sealing body, the second relay lead is arranged over the fourth side of the sealing body and extends to the inside of the sealing body.

7. The semiconductor device according to claim 1, wherein a length of a part of the first relay lead, which protrudes from the sealing body is shorter than a length of each of parts of the first leads and the second leads, which protrude from the sealing body.

8. The semiconductor device according to claim 1,
    wherein the first conductive member has a first wire and a second wire,
    wherein one end of the first wire is electrically coupled to the first electrode pad of the control semiconductor chip,
    wherein another end of the first wire located on the side opposite to the one end of the first wire is electrically coupled to the first relay lead,
    wherein one end of the second wire is electrically coupled to the first relay lead, and
    wherein another end of the second wire located on the side opposite to the one end of the second wire is electrically coupled to the first control pad of the first semiconductor chip.

9. The semiconductor device according to claim 1, wherein a distance from the first semiconductor chip to the control semiconductor chip is greater than a distance from the second semiconductor chip to the control semiconductor chip.

10. A semiconductor device comprising:
    a first semiconductor chip provided with a first power transistor and having a first surface over which a first control pad electrically coupled to a first control electrode of the first power transistor is arranged;
    a control semiconductor chip provided with a control circuit controlling the first control electrode of the first power transistor of the first semiconductor chip and having a surface over which a first electrode pad electrically coupled to the control circuit is arranged;

a plurality of first leads electrically coupled to the control semiconductor chip;
a plurality of second leads electrically coupled to the first semiconductor chip;
a first relay lead electrically coupled to the first semiconductor chip and the control semiconductor chip; and
a sealing body including a first surface having a first side, a second side opposite to the first side, and a third side extending in a direction intersecting with the first side and the second side, and a second surface being a surface located on the side opposite to the first surface, the sealing body sealing the first semiconductor chip, the control semiconductor chip, respective parts of the first leads, respective parts of the second leads, and a part of the first relay lead,
wherein the first control pad of the first semiconductor chip and the first electrode pad of the control semiconductor chip are electrically coupled by a first conductive member through the first relay lead to each other,
wherein a structure of a part of the first relay lead, which is exposed from the sealing body is different from structures of respective parts of the first leads and the second leads, which are exposed from the sealing body,
wherein the first surface of the first semiconductor chip further has a first chip mounting portion over which the first semiconductor chip is mounted so as to be opposite to the first surface of the sealing body, and
wherein when the semiconductor device is mounted over a mounting board, the first surface of the sealing body is a surface opposite to a surface of the mounting board over which the semiconductor device is mounted.

11. A semiconductor device comprising:
a first semiconductor chip provided with a first insulated gate bipolar transistor and having a first surface over which a first emitter electrode pad electrically coupled to a first emitter electrode of the first insulated gate bipolar transistor, and a first gate electrode pad electrically coupled to a first gate electrode of the first insulated gate bipolar transistor are arranged, and a first back surface formed with a first collector electrode of the first insulated gate bipolar transistor and being a surface located on the side opposite to the first surface;
a second semiconductor chip provided with a second insulated gate bipolar transistor and having a second surface over which a second emitter electrode pad electrically coupled to a second emitter electrode of the second insulated gate bipolar transistor, and a second gate electrode pad electrically coupled to a second gate electrode of the second insulated gate bipolar transistor are arranged, and a second back surface formed with a second collector electrode of the second insulated gate bipolar transistor and being a surface located on the side opposite to the second surface;
a third semiconductor chip provided with a third insulated gate bipolar transistor and having a third surface over which a third emitter electrode pad electrically coupled to a third emitter electrode of the third insulated gate bipolar transistor, and a third gate electrode pad electrically coupled to a third gate electrode of the third insulated gate bipolar transistor are arranged, and a third back surface formed with a third collector electrode of the third insulated gate bipolar transistor and being a surface located on the side opposite to the third surface;
a fourth semiconductor chip provided with a fourth insulated gate bipolar transistor and having a fourth surface over which a fourth emitter electrode pad electrically coupled to a fourth emitter electrode of the fourth insulated gate bipolar transistor, and a fourth gate electrode pad electrically coupled to a fourth gate electrode of the fourth insulated gate bipolar transistor are arranged, and a fourth back surface formed with a fourth collector electrode of the fourth insulated gate bipolar transistor and being a surface located on the side opposite to the fourth surface;
a fifth semiconductor chip provided with a fifth insulated gate bipolar transistor and having a fifth surface over which a fifth emitter electrode pad electrically coupled to a fifth emitter electrode of the fifth insulated gate bipolar transistor, and a fifth gate electrode pad electrically coupled to a fifth gate electrode of the fifth insulated gate bipolar transistor are arranged, and a fifth back surface formed with a fifth collector electrode of the fifth insulated gate bipolar transistor and being a surface located on the side opposite to the fifth surface;
a sixth semiconductor chip provided with a sixth insulated gate bipolar transistor and having a sixth surface over which a sixth emitter electrode pad electrically coupled to a sixth emitter electrode of the sixth insulated gate bipolar transistor, and a sixth gate electrode pad electrically coupled to a sixth gate electrode of the sixth insulated gate bipolar transistor are arranged, and a sixth back surface formed with a sixth collector electrode of the sixth insulated gate bipolar transistor and being a surface located on the side opposite to the sixth surface;
a control semiconductor chip having a control circuit which controls the first gate electrode of the first insulated gate bipolar transistor of the first semiconductor chip, the second gate electrode of the second insulated gate bipolar transistor of the second semiconductor chip, the third gate electrode of the third insulated gate bipolar transistor of the third semiconductor chip, the fourth gate electrode of the fourth insulated gate bipolar transistor of the fourth semiconductor chip, the fifth gate electrode of the fifth insulated gate bipolar transistor of the fifth semiconductor chip, and the sixth gate electrode of the sixth insulated gate bipolar transistor of the sixth semiconductor chip, the control semiconductor chip having a surface over which a first electrode pad, a second electrode pad, a third electrode pad, a fourth electrode pad, a fifth electrode pad, and a sixth electrode pad electrically coupled to the control circuit are arranged;
a plurality of first leads electrically coupled to the control semiconductor chip;
a first ground lead electrically coupled to the first emitter electrode pad of the first semiconductor chip and capable of supplying a ground potential from outside;
a second ground lead electrically coupled to the second emitter electrode pad of the second semiconductor chip and capable of supplying the ground potential from outside;
a third ground lead electrically coupled to the third emitter electrode pad of the third semiconductor chip and capable of supplying the ground potential from outside;
a first relay lead electrically coupled to the first semiconductor chip and the control semiconductor chip;
a second relay lead electrically coupled to the second semiconductor chip and the control semiconductor chip;
a first chip mounting portion over which the first semiconductor chip is mounted and which is electrically coupled to the first collector electrode of the first semiconductor chip and the fourth emitter electrode pad of the fourth semiconductor chip, and includes a first output lead;

a second chip mounting portion over which the second semiconductor chip is mounted and which is electrically coupled to the second collector electrode of the second semiconductor chip and the fifth emitter electrode pad of the fifth semiconductor chip, and includes a second output lead;

a third chip mounting portion over which the third semiconductor chip is mounted and which is electrically coupled to the third collector electrode of the third semiconductor chip and the sixth emitter electrode pad of the sixth semiconductor chip, and includes a third output lead;

a fourth chip mounting portion over which the fourth semiconductor chip, the fifth semiconductor chip, and the sixth semiconductor chip are mounted and which is electrically coupled to the fourth collector electrode of the fourth semiconductor chip, the fifth collector electrode of the fifth semiconductor chip, and the sixth collector electrode of the sixth semiconductor chip and includes a power supply lead capable of supplying a power supply potential from outside;

a fifth chip mounting portion over which the control semiconductor chip is mounted; and a sealing body having a first surface including a first side, a second side opposite to the first side, a third side extending in a direction intersecting the first side and the second side, and a fourth side opposite to the third side, and a second surface being a surface located on the side opposite to the first surface, the sealing body sealing the first semiconductor chip, the second semiconductor chip, the third semiconductor chip, the fourth semiconductor chip, the fifth semiconductor chip, the sixth semiconductor chip, the control semiconductor chip, respective parts of the first leads, a part of the first ground lead, a part of the second ground lead, a part of the third ground lead, a part of the first relay lead, a part of the second relay lead, a part of the first output lead, a part of the second output lead, a part of the third output lead, and a part of the power supply lead, wherein the first gate electrode pad of the first semiconductor chip and the first electrode pad of the control semiconductor chip are electrically coupled by a first conductive member through the first relay lead to each other, wherein the second gate electrode pad of the second semiconductor chip and the second electrode pad of the control semiconductor chip are electrically coupled by a second conductive member through the second relay lead to each other, and wherein a structure of a part of the first relay lead, which is exposed from the sealing body, and a structure of a part of the second relay lead, which is exposed from the sealing body, are different from structures of parts of the leads other than the first relay lead and the second relay lead, which are exposed from the sealing body.

12. The semiconductor device according to claim 11, wherein the third gate electrode pad of the third semiconductor chip and the third electrode pad of the control semiconductor chip are directly electrically coupled by a third conductive member, wherein the fourth gate electrode pad of the fourth semiconductor chip and the fourth electrode pad of the control semiconductor chip are directly electrically coupled by a fourth conductive member, wherein the fifth gate electrode pad of the fifth semiconductor chip and the fifth electrode pad of the control semiconductor chip are directly electrically coupled by a fifth conductive member, and wherein the sixth gate electrode pad of the sixth semiconductor chip and the sixth electrode pad of the control semiconductor chip are directly electrically coupled by a sixth conductive member.

13. The semiconductor device according to claim 12, wherein when viewed from the first surface side of the sealing body, in a direction in which the first side of the sealing body extends, the second chip mounting portion is interposed between the first chip mounting portion and the third chip mounting portion, and the third chip mounting portion is interposed between the second chip mounting portion and the fourth chip mounting portion, and wherein when viewed from the first surface side of the sealing body, the fifth chip mounting portion is closer to the fourth chip mounting portion than the first chip mounting portion.

14. The semiconductor device according to claim 13, wherein a seventh electrode pad capable of inputting a potential of the fourth emitter electrode pad of the fourth semiconductor chip, an eighth electrode pad capable of inputting a potential of the fifth emitter electrode pad of the fifth semiconductor chip, and a ninth electrode pad capable of inputting a potential of the sixth emitter electrode pad of the sixth semiconductor chip are arranged over the surface of the control semiconductor chip, wherein the fourth emitter electrode pad of the fourth semiconductor chip and the seventh electrode pad of the control semiconductor chip are directly electrically coupled by a seventh conductive member, wherein the fifth emitter electrode pad of the fifth semiconductor chip and the eighth electrode pad of the control semiconductor chip are directly electrically coupled by an eighth conductive member, and wherein the sixth emitter electrode pad of the sixth semiconductor chip and the ninth electrode pad of the control semiconductor chip are directly electrically coupled by a ninth conductive member.

15. The semiconductor device according to claim 14, wherein when viewed from the first surface side of the sealing body, the first leads are arranged along the first side of the sealing body, wherein when viewed from the first surface side of the sealing body, the first output lead, the second output lead, the third output lead, the first ground lead, the second ground lead, the third ground lead, and the power supply lead are arranged along the second side of the sealing body, wherein when viewed from the first surface side of the sealing body, the first relay lead is arranged over the third side of the sealing body and extends to the inside of the sealing body, and wherein when viewed from the first surface side of the sealing body, the second relay lead is arranged over the fourth side and extends to the inside of the sealing body.

16. The semiconductor device according to claim 15, wherein when planarly viewed from the first surface side of the sealing body, the part of the second relay lead is interposed between the fourth chip mounting portion and the fifth chip mounting portion, and the fourth conductive member, the fifth conductive member, the sixth conductive member, the seventh conductive member, the eighth conductive member, and the ninth conductive member overlap with the part of the second relay lead.

17. The semiconductor device according to claim 11, wherein a length of each of the parts of the first and second relay leads, which protrude from the sealing body is shorter than a length of each of the parts of the leads other than the first relay lead and the second relay lead, which protrude from the sealing body.

18. The semiconductor device according to claim 11,
wherein the first conductive member has a first wire and a second wire,
wherein the second conductive member has a third wire and a fourth wire,
wherein one end of the first wire is electrically coupled to the first electrode pad of the control semiconductor chip,
wherein another end of the first wire located on the side opposite to the one end of the first wire is electrically coupled to the first relay lead,
wherein one end of the second wire is electrically coupled to the first relay lead,
wherein another end of the second wire located on the side opposite to the one end of the second wire is electrically coupled to the first gate electrode pad of the first semiconductor chip,
wherein one end of the third wire is electrically coupled to the second electrode pad of the control semiconductor chip,
wherein another end of the third wire located on the side opposite to the one end of the third wire is electrically coupled to the second relay lead,
wherein one end of the fourth wire is electrically coupled to the second relay lead, and
wherein another end of the fourth wire located on the side opposite to the one end of the fourth wire is electrically coupled to the second gate electrode pad of the second semiconductor chip.

19. The semiconductor device according to claim 11,
wherein the first surface of the first semiconductor chip, the second surface of the second semiconductor chip, the third surface of the third semiconductor chip, the fourth surface of the fourth semiconductor chip, the fifth surface of the fifth semiconductor chip, the sixth surface of the sixth semiconductor chip, and the surface of the control semiconductor chip face the first surface of the sealing body, and
wherein when the semiconductor device is mounted over a mounting board, the first surface of the sealing body is a surface opposite to a surface of the mounting board, over which the semiconductor device is mounted.

* * * * *